(12) United States Patent
Choi et al.

(10) Patent No.: US 11,881,508 B2
(45) Date of Patent: Jan. 23, 2024

(54) METHOD OF FABRICATING A SEMICONDUCTOR DEVICE

(71) Applicant: SAMSUNG ELECTRONICS CO., LTD., Suwon-si (KR)

(72) Inventors: Kyungin Choi, Seoul (KR); Hyunchul Song, Seoul (KR); Sunjung Kim, Suwon-si (KR); Taegon Kim, Seoul (KR); Seong Hoon Jeong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/843,105

(22) Filed: Jun. 17, 2022

(65) Prior Publication Data

US 2022/0320278 A1    Oct. 6, 2022

Related U.S. Application Data

(63) Continuation of application No. 17/028,042, filed on Sep. 22, 2020, now Pat. No. 11,380,760, which is a (Continued)

(30) Foreign Application Priority Data

Jun. 22, 2018    (KR) .................. 10-2018-0071961

(51) Int. Cl.
*H01L 29/06* (2006.01)
*H01L 21/02* (2006.01)
(Continued)

(52) U.S. Cl.
CPC .... *H01L 29/0653* (2013.01); *H01L 21/02164* (2013.01); *H01L 21/02271* (2013.01);
(Continued)

(58) Field of Classification Search
CPC . H01L 21/76; H01L 21/762; H01L 21/76224; H01L 21/76229;
(Continued)

(56) References Cited

U.S. PATENT DOCUMENTS

| 5,950,090 A | 9/1999 | Chen et al. |
| 6,177,299 B1 | 1/2001 | Hsu et al. |

(Continued)

FOREIGN PATENT DOCUMENTS

| CN | 106356301 A | 1/2017 |
| CN | 107785322 A | 3/2018 |

(Continued)

*Primary Examiner* — Sonya McCall-Shepard
(74) *Attorney, Agent, or Firm* — Muir Patent Law, PLLC

(57) ABSTRACT

A semiconductor device includes a substrate including a first active pattern and a second active pattern, a device isolation layer filling a first trench between the first and second active patterns, the device isolation layer including a silicon oxide layer doped with helium, a helium concentration of the device isolation layer being higher than a helium concentration of the first and second active patterns, and a gate electrode crossing the first and second active patterns.

19 Claims, 42 Drawing Sheets

Related U.S. Application Data continuation of application No. 16/243,415, filed on Jan. 9, 2019, now Pat. No. 10,847,611.

(51) Int. Cl.

| | | |
|---|---|---|
| *H01L 21/3105* | (2006.01) | |
| *H01L 21/3115* | (2006.01) | |
| *H01L 21/762* | (2006.01) | |
| *H01L 21/8238* | (2006.01) | |
| *H01L 27/092* | (2006.01) | |
| *H10B 10/00* | (2023.01) | |
| *H01L 21/308* | (2006.01) | |
| *H01L 29/66* | (2006.01) | |
| *H01L 29/78* | (2006.01) | |
| *H01L 21/8234* | (2006.01) | |
| *H01L 27/088* | (2006.01) | |
| *H01L 29/165* | (2006.01) | |
| *H01L 29/08* | (2006.01) | |

(52) U.S. Cl.
CPC .............. *H01L 21/3105* (2013.01); *H01L 21/31155* (2013.01); *H01L 21/76224* (2013.01); *H01L 21/823828* (2013.01); *H01L 21/823878* (2013.01); *H01L 27/0924* (2013.01); *H01L 29/0847* (2013.01); *H10B 10/12* (2023.02); *H01L 21/02208* (2013.01); *H01L 21/308* (2013.01); *H01L 21/823821* (2013.01); *H01L 29/6656* (2013.01); *H01L 29/66545* (2013.01)

(58) Field of Classification Search
CPC ......... H01L 21/76232; H01L 21/76237; H01L 21/02107; H01L 21/02123; H01L 21/02126; H01L 21/0214; H01L 21/02164; H01L 21/0223; H01L 21/02225; H01L 21/02318–02326; H01L 21/02296; H01L 21/02299; H01L 21/02307; H01L 21/0231; H01L 21/02312; H01L 21/265–26513; H01L 21/3105; H01L 21/3115; H01L 21/31155; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 29/0847; H01L 29/66545; H01L 27/088; H01L 27/092; H01L 29/0653; H01L 21/823878; H01L 29/0642

See application file for complete search history.

(56) References Cited

U.S. PATENT DOCUMENTS

| | | | |
|---|---|---|---|
| 9,184,087 B2 | 11/2015 | Chiang et al. | |
| 9,396,986 B2* | 7/2016 | Tsai | H01L 21/76237 |
| 9,824,937 B1 | 11/2017 | Wang et al. | |
| 10,243,045 B2 | 3/2019 | Yu et al. | |
| 10,629,741 B1 | 4/2020 | Sung et al. | |
| 2004/0266199 A1 | 12/2004 | Lee | |
| 2007/0049034 A1 | 3/2007 | Liou et al. | |
| 2007/0049046 A1 | 3/2007 | Sawada et al. | |
| 2010/0283108 A1* | 11/2010 | Sawada | H01L 21/3105 257/E27.06 |
| 2012/0032267 A1 | 2/2012 | Cheng et al. | |
| 2013/0295732 A1 | 11/2013 | Wu et al. | |
| 2015/0187634 A1 | 7/2015 | Chiang et al. | |
| 2017/0025535 A1 | 1/2017 | Wu et al. | |
| 2018/0145131 A1* | 5/2018 | Wang | H01L 29/66545 |
| 2018/0219009 A1* | 8/2018 | Liu | H01L 21/76224 |
| 2018/0240670 A1* | 8/2018 | Hatem | H01L 21/225 |
| 2019/0035691 A1* | 1/2019 | Okuno | H01L 29/66795 |
| 2019/0067027 A1* | 2/2019 | Wang | H01L 21/02211 |
| 2020/0105604 A1 | 4/2020 | Lin et al. | |

FOREIGN PATENT DOCUMENTS

| | | |
|---|---|---|
| KR | 10-0545207 B1 | 1/2006 |
| KR | 10-0780644 B1 | 11/2007 |
| KR | 10-2010-0001867 A | 1/2010 |
| WO | WO 2012/097606 A1 | 7/2012 |

* cited by examiner

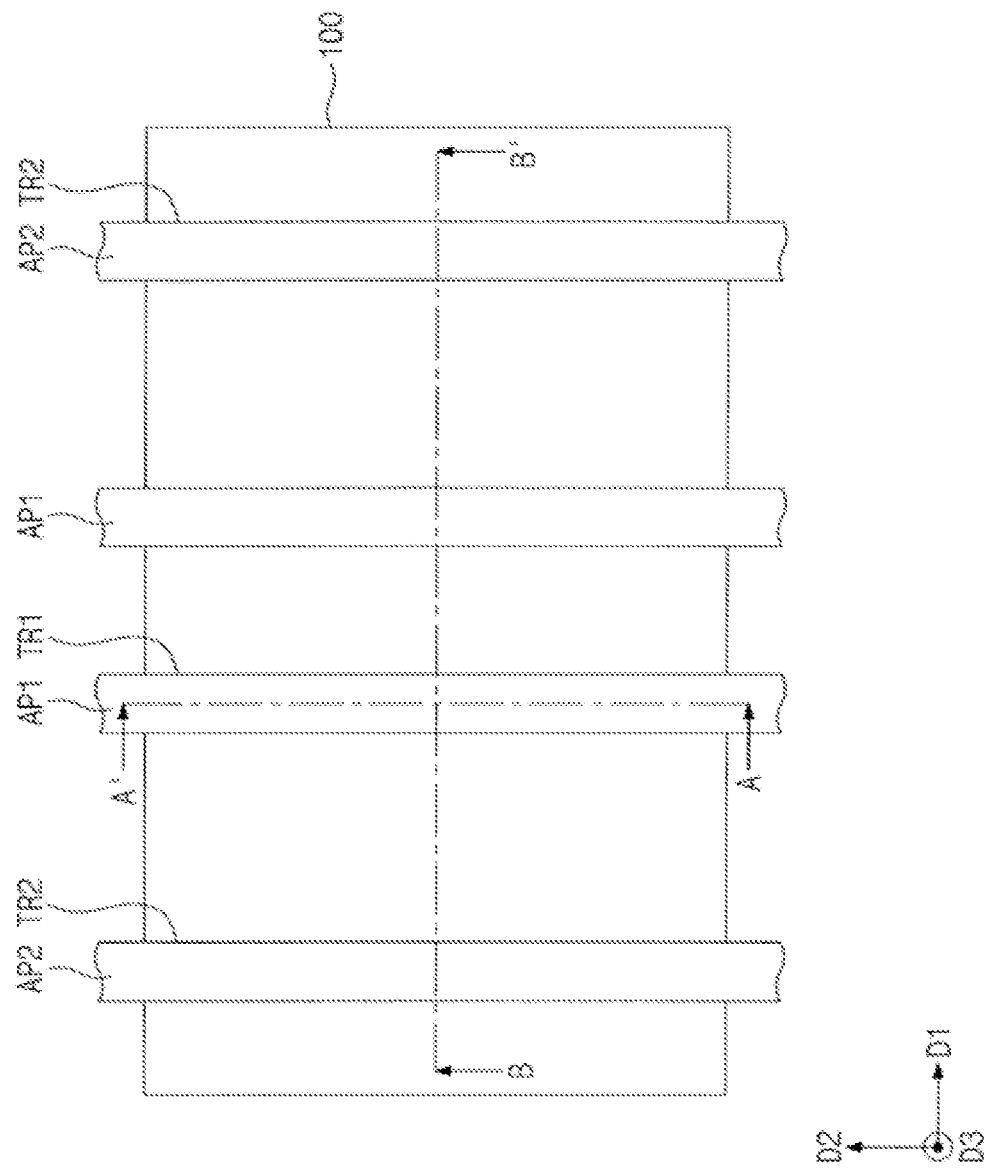

METHOD OF FABRICATING A SEMICONDUCTOR DEVICE

CROSS-REFERENCE TO RELATED APPLICATIONS

This is a continuation application based on application Ser. No. 17/028,042, filed Sep. 22, 2020, which in turn is a continuation of application Ser. No. 16/243,415, filed Jan. 9, 2019, now U.S. Pat. No. 10,847,611 B2, issued Nov. 24, 2020, the entire contents of both being hereby incorporated by reference.

Korean Patent Application No. 10-2018-0071961, filed on Jun. 22, 2018, in the Korean Intellectual Property Office, and entitled: "Semiconductor Device and Method of Fabricating The Same," is incorporated by reference herein in its entirety.

BACKGROUND

1. Field

Embodiments relate to a semiconductor device and a method of fabricating the same.

2. Description of the Related Art

Due to their small-sized, multifunctional, and/or low-cost characteristics, semiconductor devices are important elements in the electronics industry. Semiconductor devices may be, e.g., a memory device for storing data, a logic device for processing data, and a hybrid device including both of memory and logic elements.

SUMMARY

Embodiments are directed to a semiconductor device, including a substrate including a first active pattern and a second active pattern, a device isolation layer filling a first trench between the first and second active patterns, the device isolation layer including a silicon oxide layer doped with helium, a helium concentration of the device isolation layer being higher than a helium concentration of the first and second active patterns, and a gate electrode crossing the first and second active patterns.

Embodiments are also directed to a semiconductor device, including a substrate, a device isolation layer on the substrate, the device isolation layer defining a first active pattern and a second active pattern of the substrate, and a gate electrode crossing the first and second active patterns. The device isolation layer may include a first portion and a second portion, which are located below the gate electrode, the first portion may be interposed between the first and second active patterns and covers a first sidewall of the first active pattern, the second portion may cover a second sidewall opposite to the first sidewall of the first active pattern, and a level of a top surface of the first portion may be different from a level of a top surface of the second portion.

Embodiments are also directed to a method of fabricating a semiconductor device, including patterning a substrate to form active patterns, and forming a device isolation layer to fill a trench between the active patterns, the forming of the device isolation layer including forming a preliminary insulating layer on the substrate to fill the trench, performing a first ion implantation process to inject a light species into the preliminary insulating layer, and performing a wet annealing process on the preliminary insulating layer. The first ion implantation process may be performed at a temperature of 100° C. to 600° C., and the light species may include at least one selected from the group of H, He, C, N, O, Ar, Kr and Xe.

BRIEF DESCRIPTION OF THE DRAWINGS

Features will become apparent to those of skill in the art by describing in detail example embodiments with reference to the attached drawings in which:

FIGS. 3, 5, 9, 11, and 13 illustrate plan views illustrating a method of fabricating a semiconductor device, according to an example embodiment.

DETAILED DESCRIPTION

It should be noted that the figures are intended to illustrate the general characteristics of methods, structure and/or materials utilized in certain example embodiments and to supplement the written description provided below. The drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1:
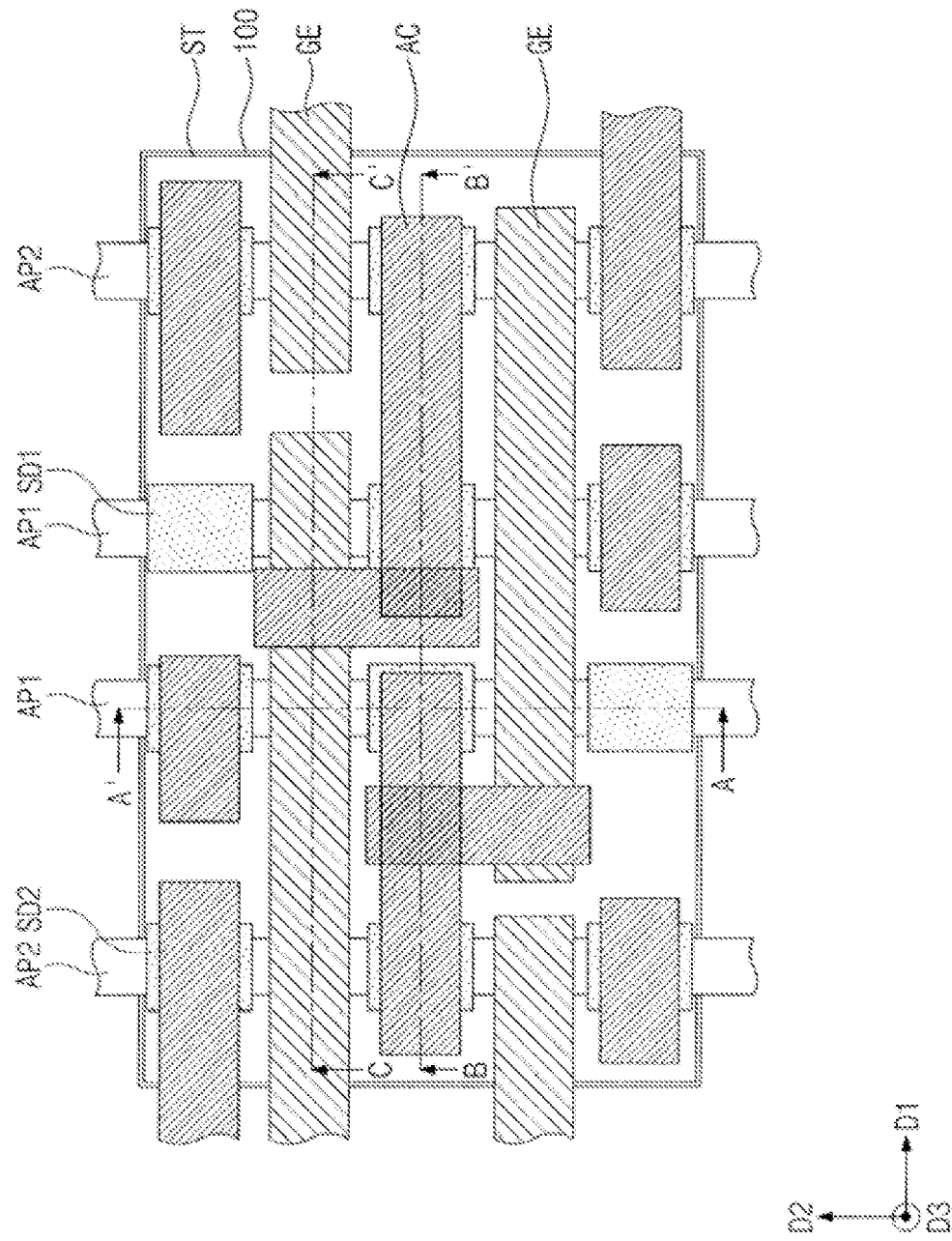
FIG. 1 illustrates a plan view illustrating a semiconductor device according to an example embodiment.
Figure 2A:
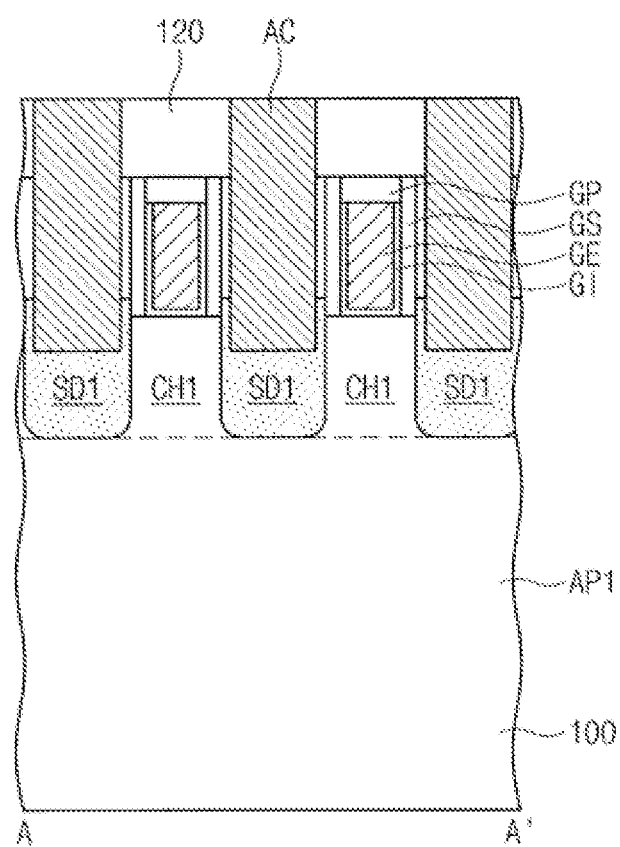
FIGS. 2A to 2C illustrate sectional views taken along lines A-A', B-B', and C-C', respectively, of FIG. 1.
Figure 2B:
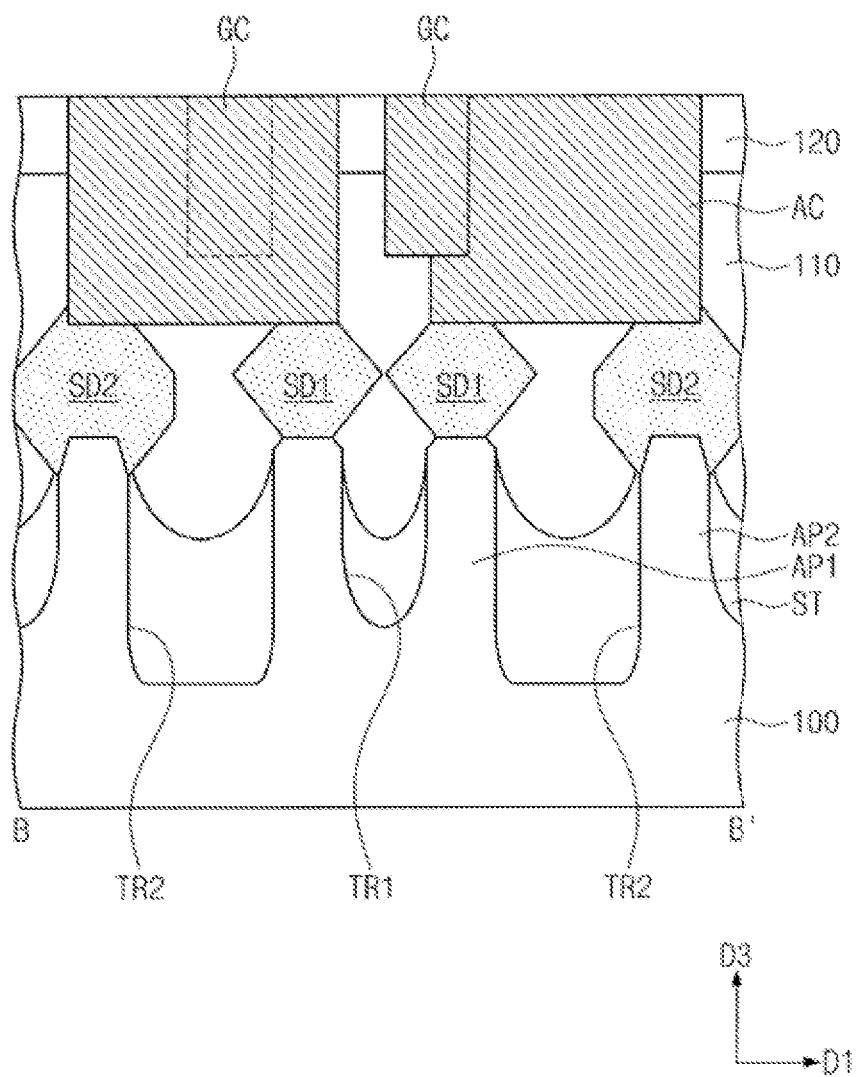
Figure 2C:
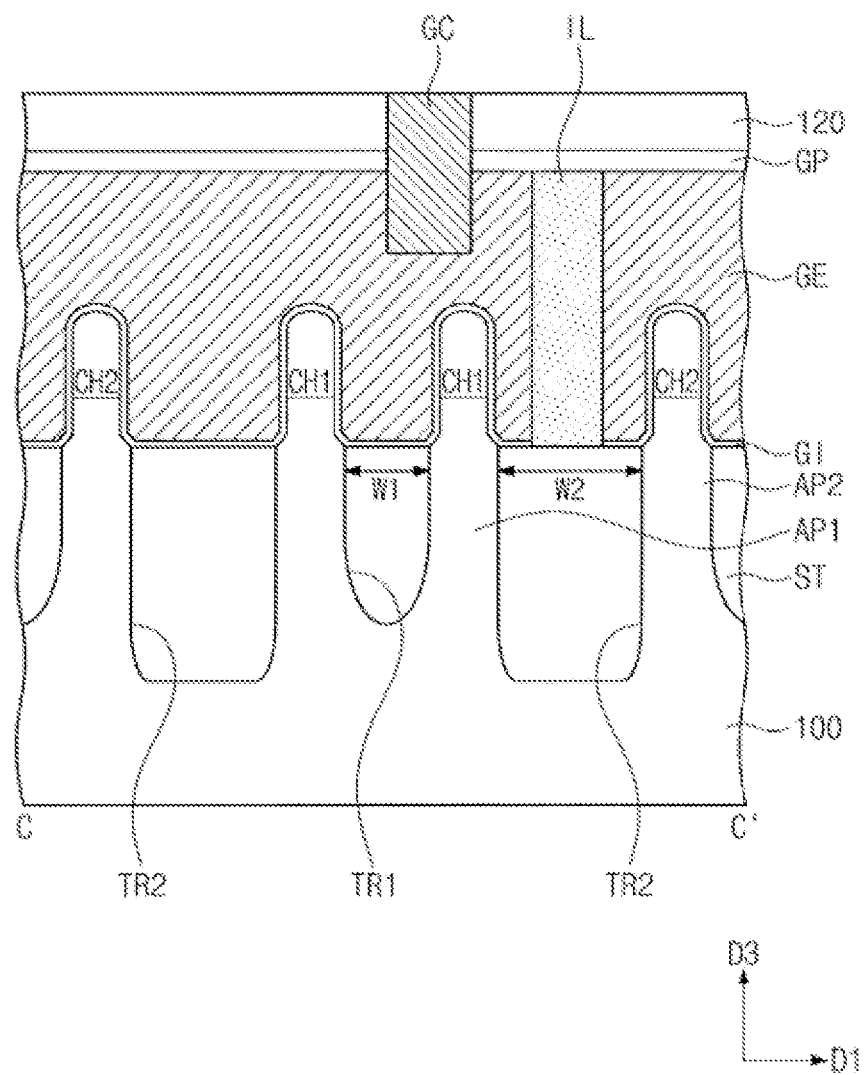

FIG. 1 is a plan view illustrating a semiconductor device according to an example embodiment. FIGS. 2A to 2C are sectional views taken along lines A-A', B-B', and C-C', respectively, of FIG. 1.

Referring to FIG. 1 and FIGS. 2A to 2C, a substrate 100 including a memory cell region may be provided. As an example, a plurality of memory cell transistors constituting a plurality of SRAM cells may be provided on the memory cell region of the substrate 100.

A device isolation layer ST may be provided on the substrate 100. The device isolation layer ST may be formed to define first and second active patterns AP1 and AP2. The substrate 100 may be a semiconductor substrate (e.g., of silicon, germanium, or silicon-germanium) or a compound semiconductor substrate. The device isolation layer ST may be formed of or include an insulating material (e.g., silicon oxide).

The first and second active patterns AP1 and AP2 may be portions of the substrate 100. The first and second active patterns AP1 and AP2 may extend parallel to each other and in a second direction D2. A first trench TR1 may be defined between an adjacent pair of first active patterns AP1. A second trench TR2 may be defined between the first and second active patterns AP1 and AP2 adjacent to each other. A depth of the second trench TR2 may be greater than a depth of the first trench TR1. A bottom level of the second trench TR2 may be lower than a bottom level of the first trench TR1.

When measured in a first direction D1, an upper portion of the first trench TR1 may have a first width W1, and an upper portion of the second trench TR2 may have a second width W2. The second width W2 may be greater than the first width W1. A distance between the first and second active patterns AP1 and AP2 adjacent to each other may be greater than a distance between an adjacent pair of the first active patterns AP1.

The device isolation layer ST may be provided to fill the first and second trenches TR1 and TR2. The upper portions of the first and second active patterns AP1 and AP2 may extend in a vertical direction, thereby having a protruding shape relative to the device isolation layer ST. Each of the upper portions of the first and second active patterns AP1 and AP2 may be a fin-shape structure vertically protruding above the device isolation layer ST.

The device isolation layer ST may further contain a material having a relatively small atomic weight. For example, the device isolation layer ST may contain at least one light species that is selected from the group of H, He, C, N, Ar, Kr and Xe. The device isolation layer ST may contain the light species as dopants. A concentration (e.g., atomic percent) of the light species in the device isolation layer ST may be higher than that of the light species in the first and second active patterns AP1 and AP2. As an example, the device isolation layer ST may contain helium (He). A helium concentration of the device isolation layer ST may be greater than a helium concentration of the first and second active patterns AP1 and AP2.

First channels CH1 and first source/drain patterns SD1 may be provided in or on the upper portions of the first active patterns AP1. Second channels CH2 and second source/drain patterns SD2 may be provided in or on the upper portions of the second active patterns AP2. The first source/drain patterns SD1 may be p-type impurity regions. The second source/drain patterns SD2 may be n-type impurity regions. Each of the first channels CH1 may be interposed between a pair of the first source/drain patterns SD1, and each of the second channels CH2 may be interposed between a pair of the second source/drain patterns SD2.

The first and second source/drain patterns SD1 and SD2 may be epitaxial patterns, which may be formed using a selective epitaxial growth process. The first and second source/drain patterns SD1 and SD2 may have top surfaces that are located at a higher level than those of the first and second channels CH1 and CH2. The first and second source/drain patterns SD1 and SD2 may contain a semiconductor element, which may be the same as or different from that of the substrate 100. As an example, the first source/drain patterns SD1 may be formed of or include a semiconductor material whose lattice constant is greater than that of the substrate 100. In this case, the first source/drain patterns SD1 may exert a compressive stress to the first channels CH1. The first source/drain patterns SD1 may be formed of or include, e.g., silicon-germanium (SiGe). The second source/drain patterns SD2 may be formed of or include the same semiconductor material as that of the substrate 100. The second source/drain patterns SD2 may be formed of or include, e.g., silicon (Si).

Gate electrodes GE may be provided to cross the first and second active patterns AP1 and AP2 and to extend in the first direction D1. The gate electrodes GE may be vertically overlapped with the first and second channels CH1 and CH2. As an example, the gate electrodes GE may be formed of or include at least one of conductive metal nitrides (e.g., titanium nitride or tantalum nitride) or metallic materials (e.g., titanium, tantalum, tungsten, copper, or aluminum).

An insulating pattern IL may be interposed between adjacent ones of the gate electrodes GE, in the first direction D1, as shown in FIG. 2C. For example, the insulating pattern IL may be used to separate the adjacent ones of the gate electrodes GE from each other.

Gate spacers GS may be respectively provided on opposite sidewalls of each of the gate electrodes GE. The gate spacers GS may extend along the gate electrodes GE or in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of $SiO_2$, SiCN, SiCON, or SiN. In some example embodiments, the gate spacers GS may include a multi-layered structure that is made of at least two of $SiO_2$, SiCN, SiCON, or SiN.

Gate dielectric patterns GI may be interposed between the gate electrodes GE and the first and second active patterns AP1 and AP2. Each of the gate dielectric patterns GI may extend along a bottom surface of a corresponding one of the gate electrodes GE. Each of the gate dielectric patterns GI may be provided to cover top and two side surfaces of each of the first and second channels CH1 and CH2. The gate dielectric patterns GI may be formed of or include at least one high-k dielectric material. For example, the high-k dielectric materials may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping patterns GP may be provided on each of the gate electrodes GE. The gate capping patterns GP may extend along the gate electrodes GE or in the first direction D1. The gate capping pattern GP may be interposed between a pair of the gate spacers GS. The gate capping patterns GP may be formed of or include a material that is selected to have an etch selectivity with respect to first to fourth interlayer insulating layers 110, 120, 130, and 140 to be described below. For example, the gate capping patterns GP may be formed of or include at least one of SiON, SiCN, SiCON, or SiN.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with top surfaces of the gate capping patterns GP and top surfaces of the gate spacers GS. The second interlayer insulating layer 120 may be provided on the first interlayer insulating layer 110 to cover the top surfaces of the gate capping patterns GP and the top surfaces of the gate spacers GS.

Active contacts AC may be provided at opposite sides of each of the gate electrodes GE. The active contacts AC may be provided to penetrate the second interlayer insulating layer 120 and the first interlayer insulating layer 110, and may be coupled to the first and second source/drain patterns SD1 and SD2. The active contacts AC may have top surfaces that are coplanar with the top surface of the second interlayer insulating layer 120. The active contacts AC may be formed of or include at least one conductive metal nitride (e.g., titanium nitride or tantalum nitride) or metallic material (e.g., titanium, tantalum, tungsten, copper, or aluminum).

Gate contacts GC may be provided on the gate electrodes GE. Each of the gate contacts GC may be provided to penetrate the second interlayer insulating layer 120, the first interlayer insulating layer 110, and the gate capping pattern GP and may be coupled to the gate electrode GE. The gate contacts GC may have top surfaces that are coplanar with the top surface of the second interlayer insulating layer 120. The gate contacts GC may have bottom surfaces that are located at a higher level than that of bottom surfaces of the active contacts AC.

The gate contacts GC may be formed of or include at least one conductive metal nitride (e.g., titanium nitride or tantalum nitride) or metallic material (e.g., titanium, tantalum, tungsten, copper, or aluminum). The gate contacts GC may be formed of or include the same material as the active contacts AC. As an example, one of the gate contacts GC may be electrically connected to at least one of the active contacts AC, thereby constituting a single conductive structure.

Figure 7A:
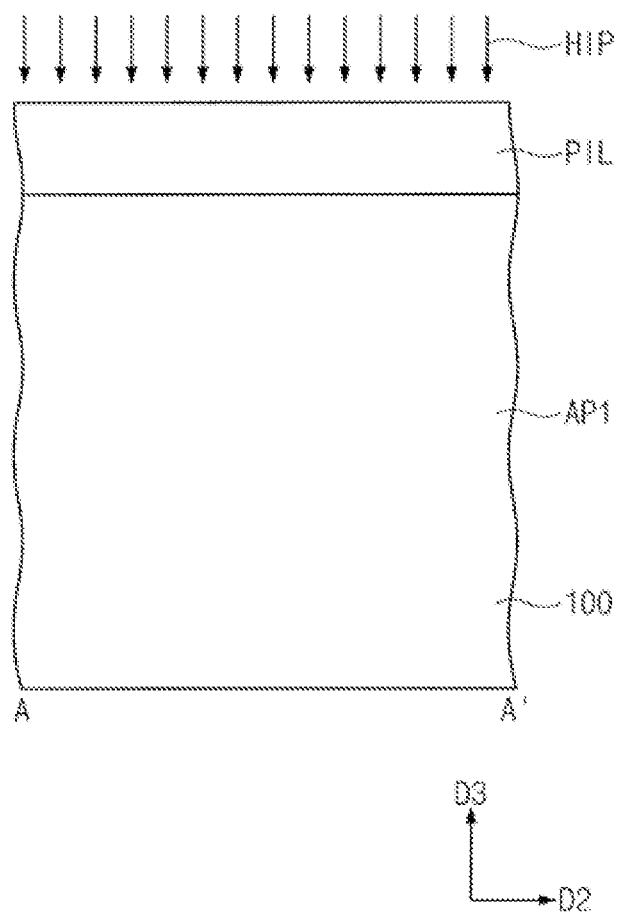
FIGS. 7A and 8A illustrate sectional views, which are taken along line A-A' of FIG. 5 and are presented to illustrate some steps in a process of forming a device isolation layer.
Figure 7B:
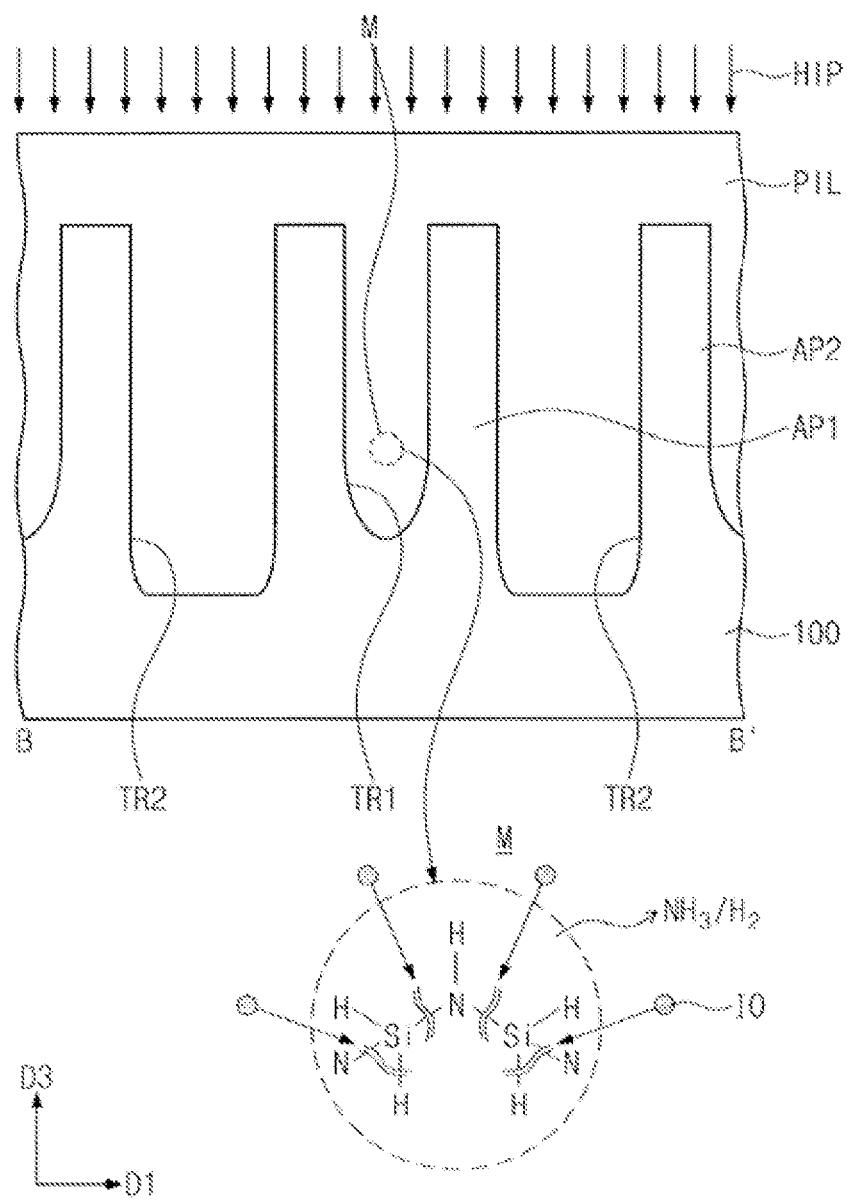
FIGS. 7B and 8B illustrate sectional views, which are taken along line B-B' of FIG. 5 and are presented to illustrate some steps in a process of forming a device isolation layer.
Figure 8A:
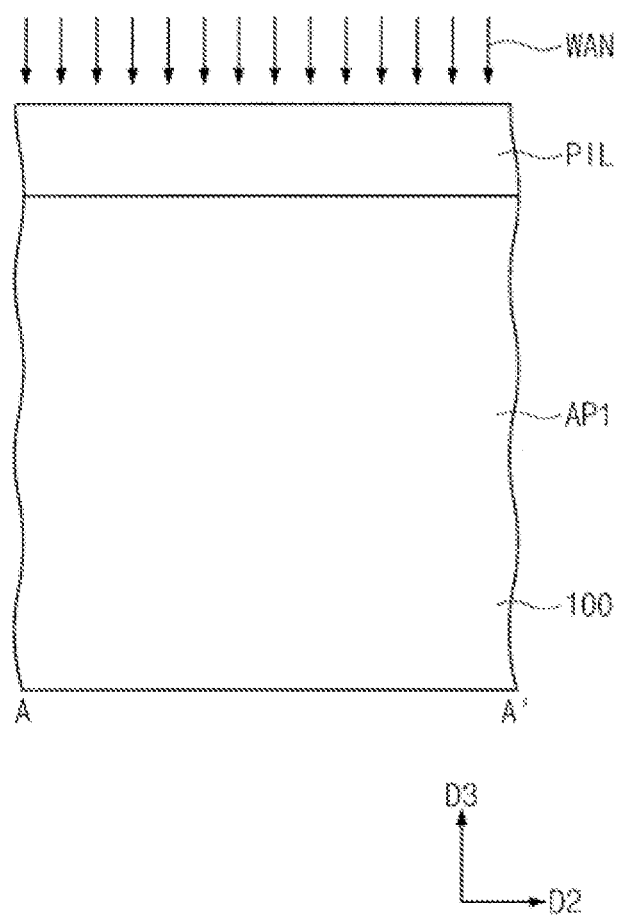
Figure 8B:
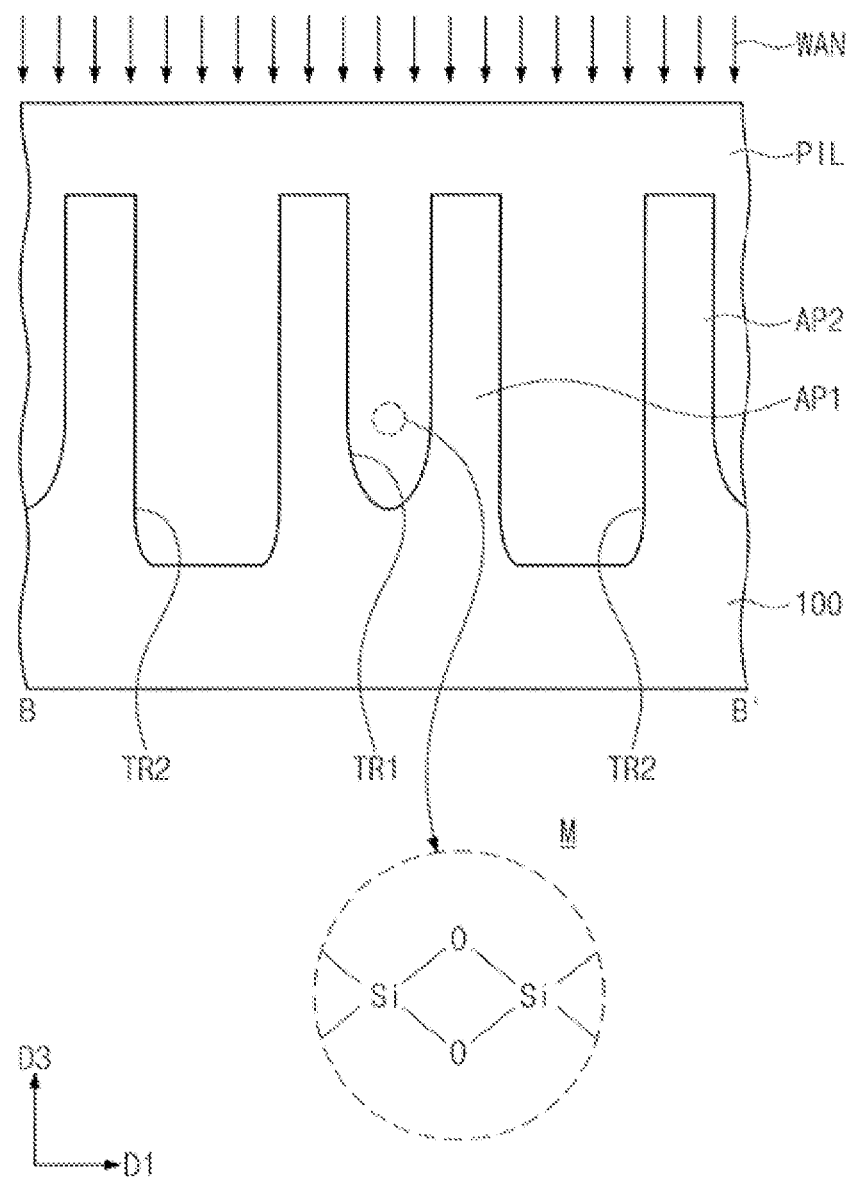
Figure 9:
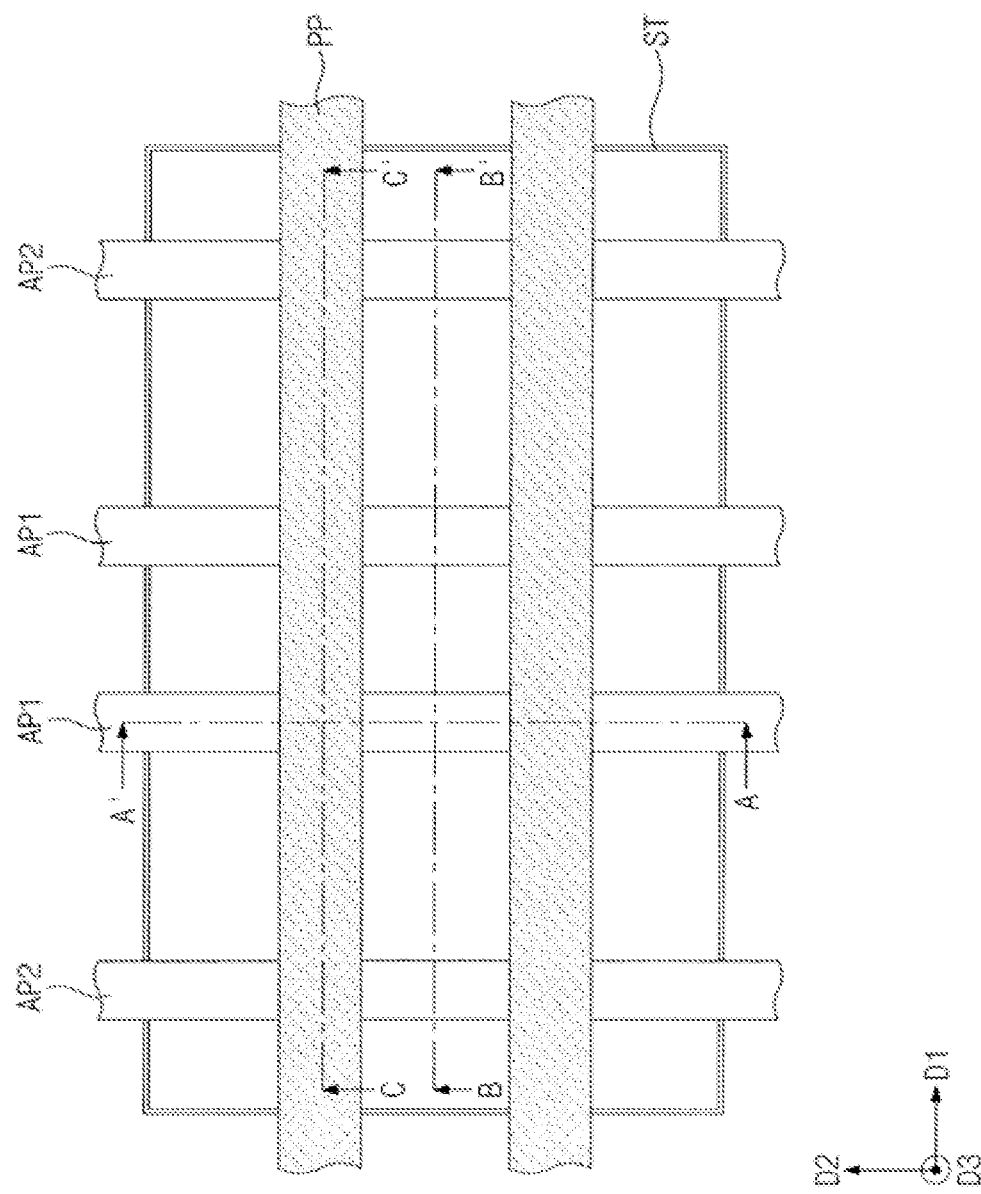
Figure 10A:
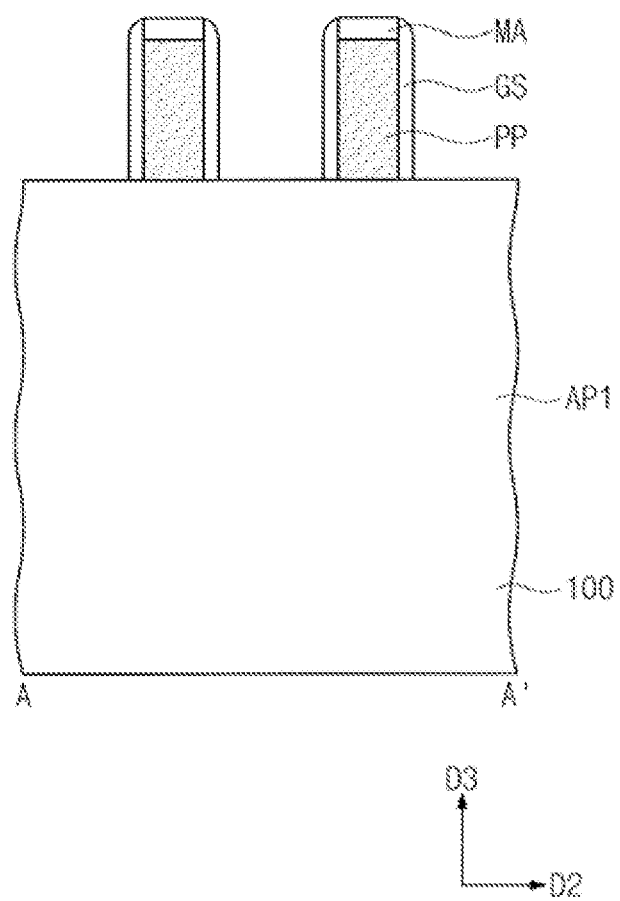
Figure 10B:
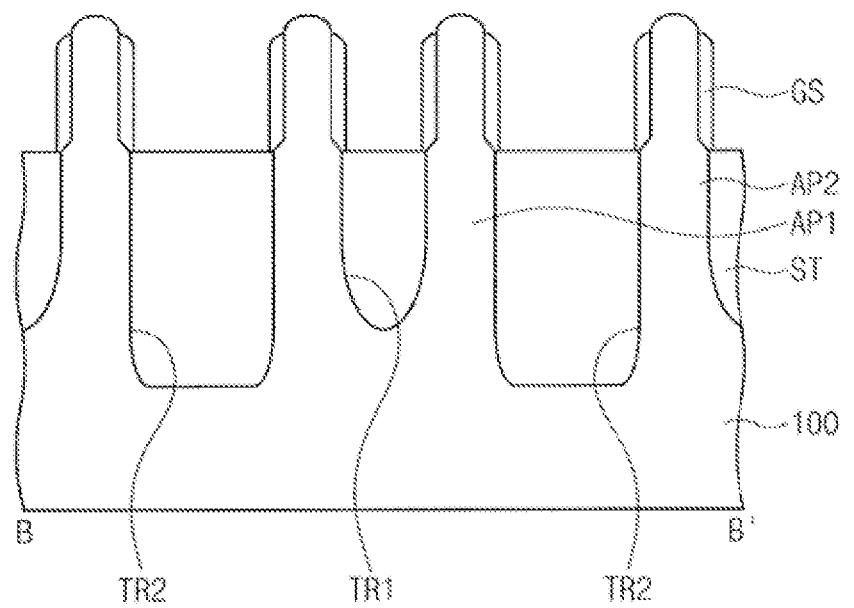
Figure 10C:
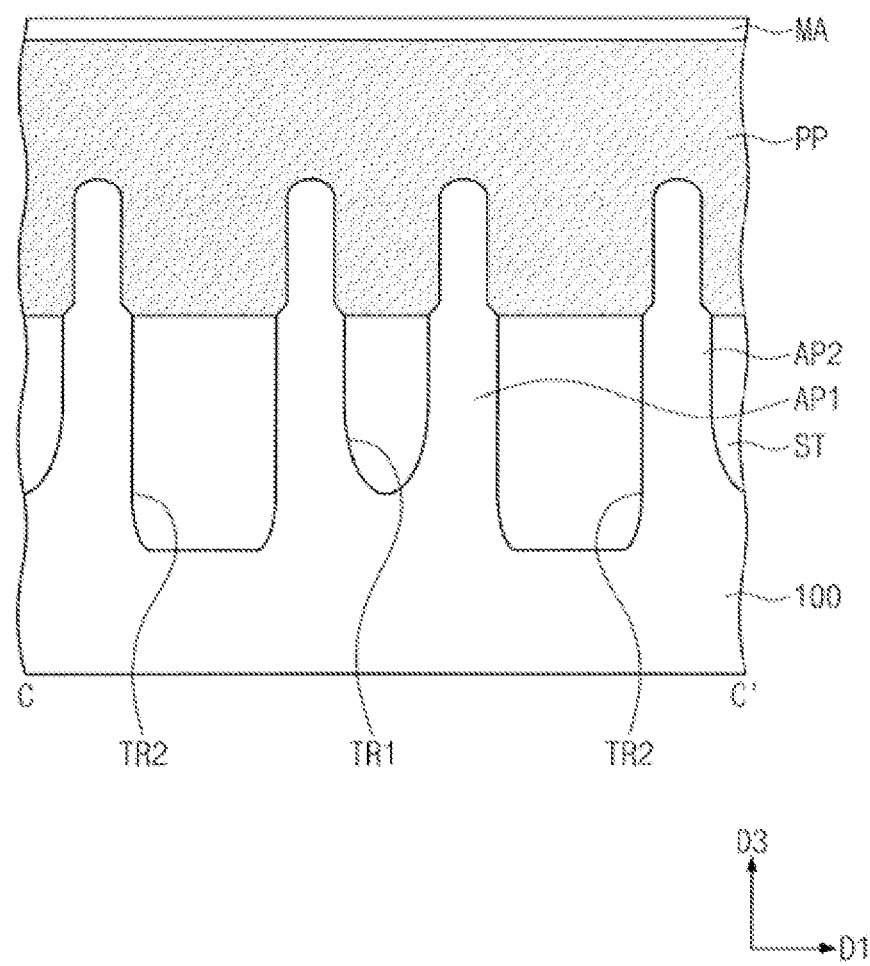
FIGS. 10C, 12C, and 14C illustrate sectional views taken along lines C-C' of FIGS. 9, 11, and 13, respectively.
Figure 11:
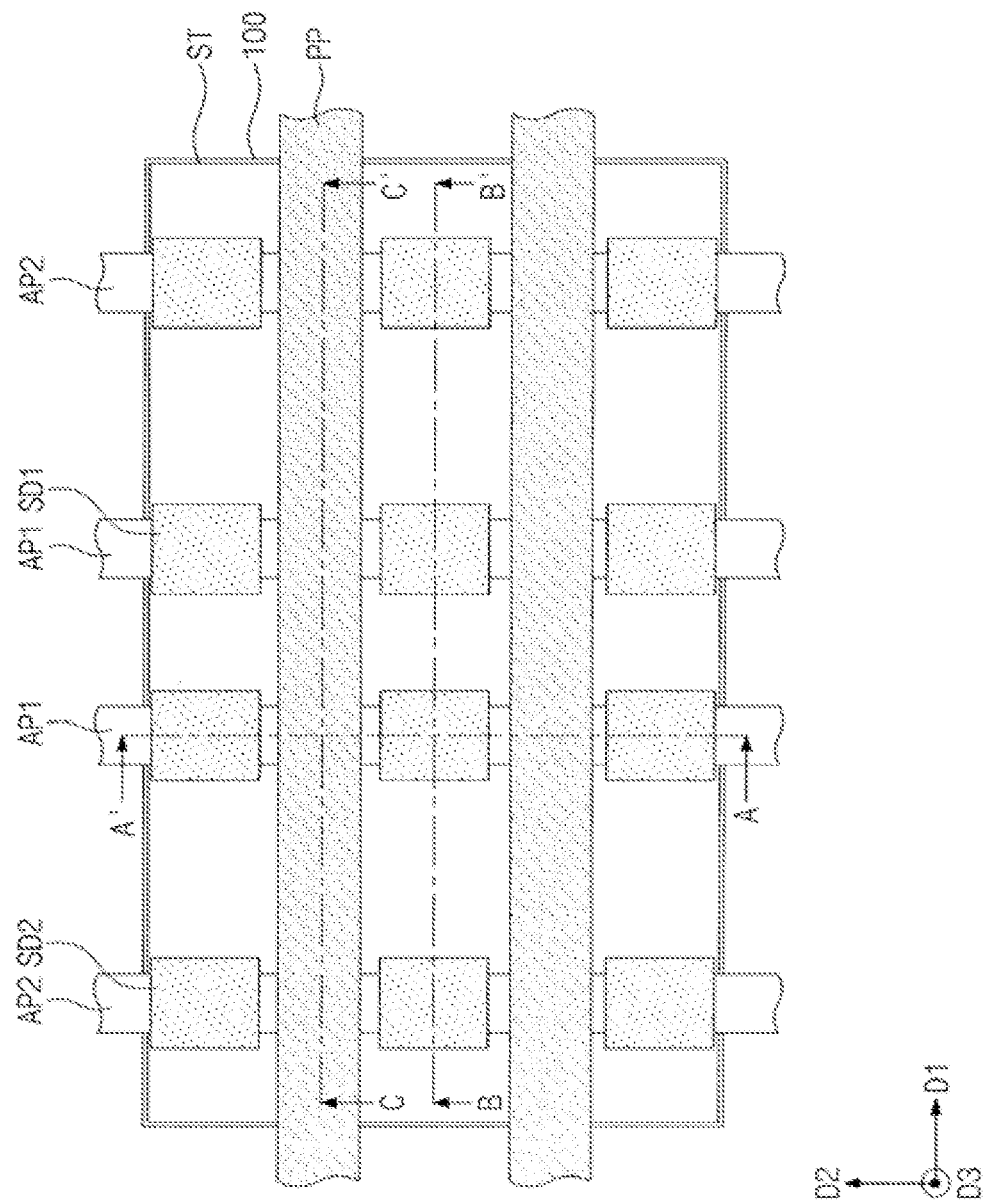
Figure 12A:
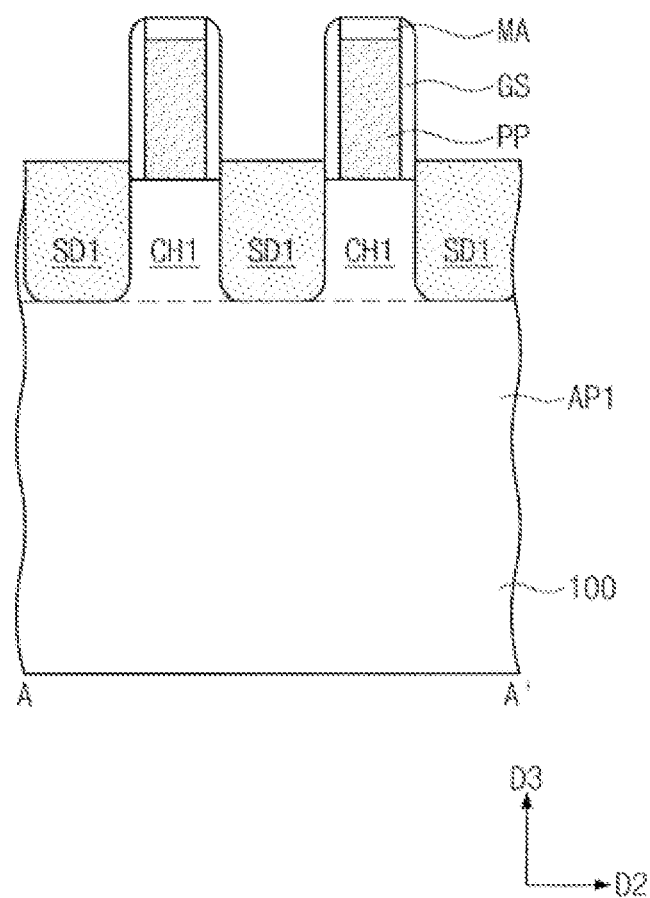
Figure 12B:
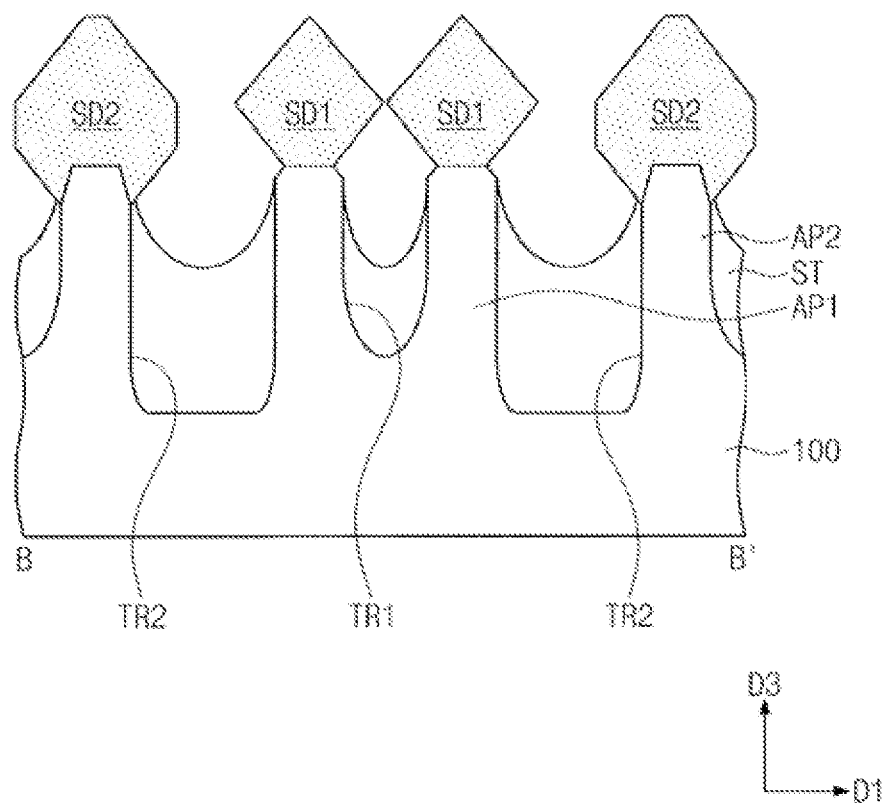
Figure 12C:
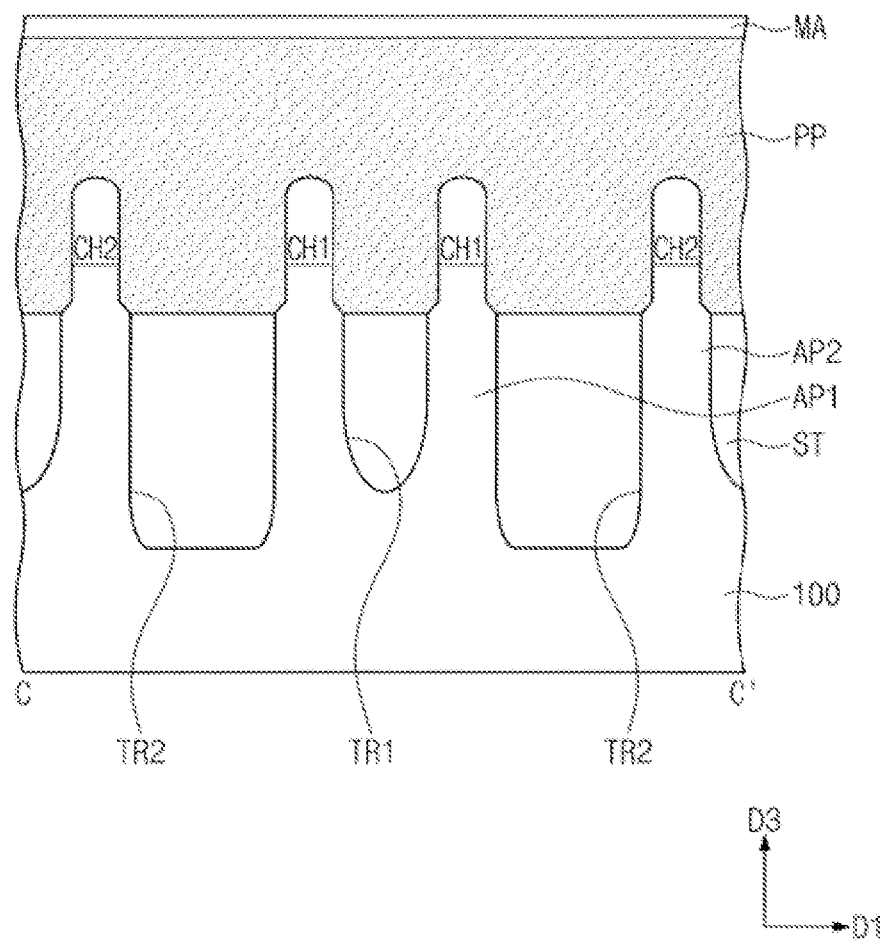
Figure 13:
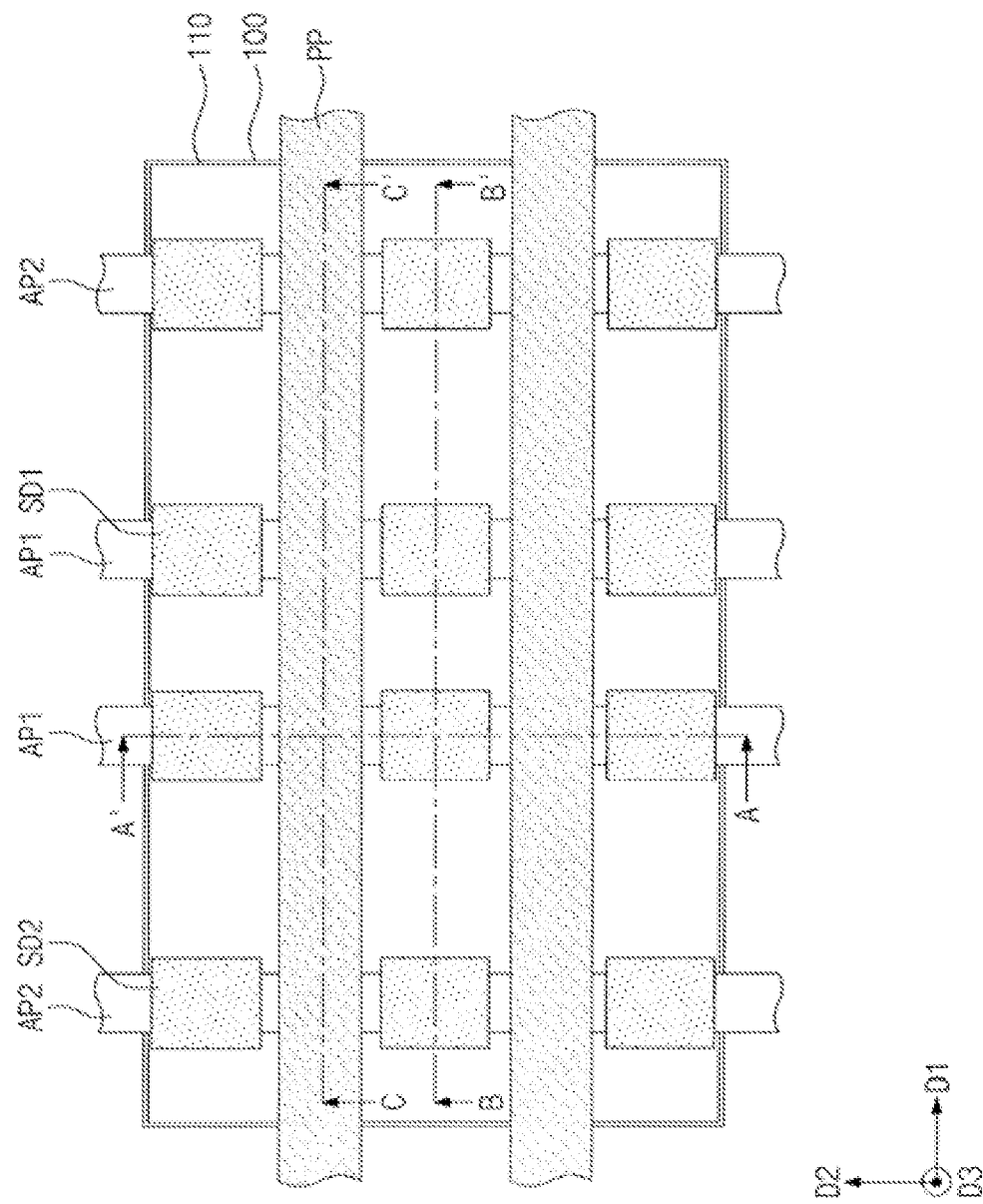
Figure 14A:
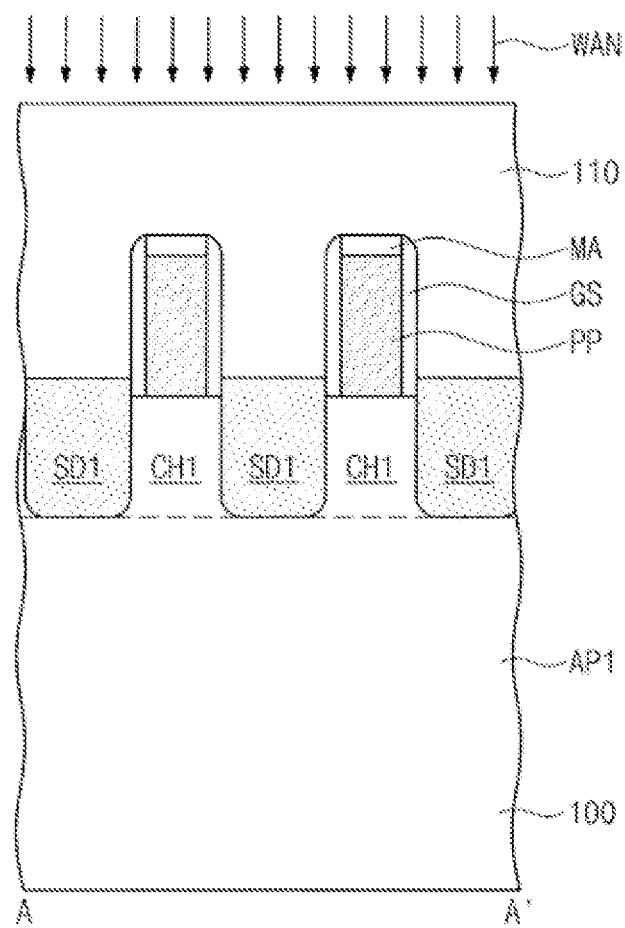
Figure 14B:
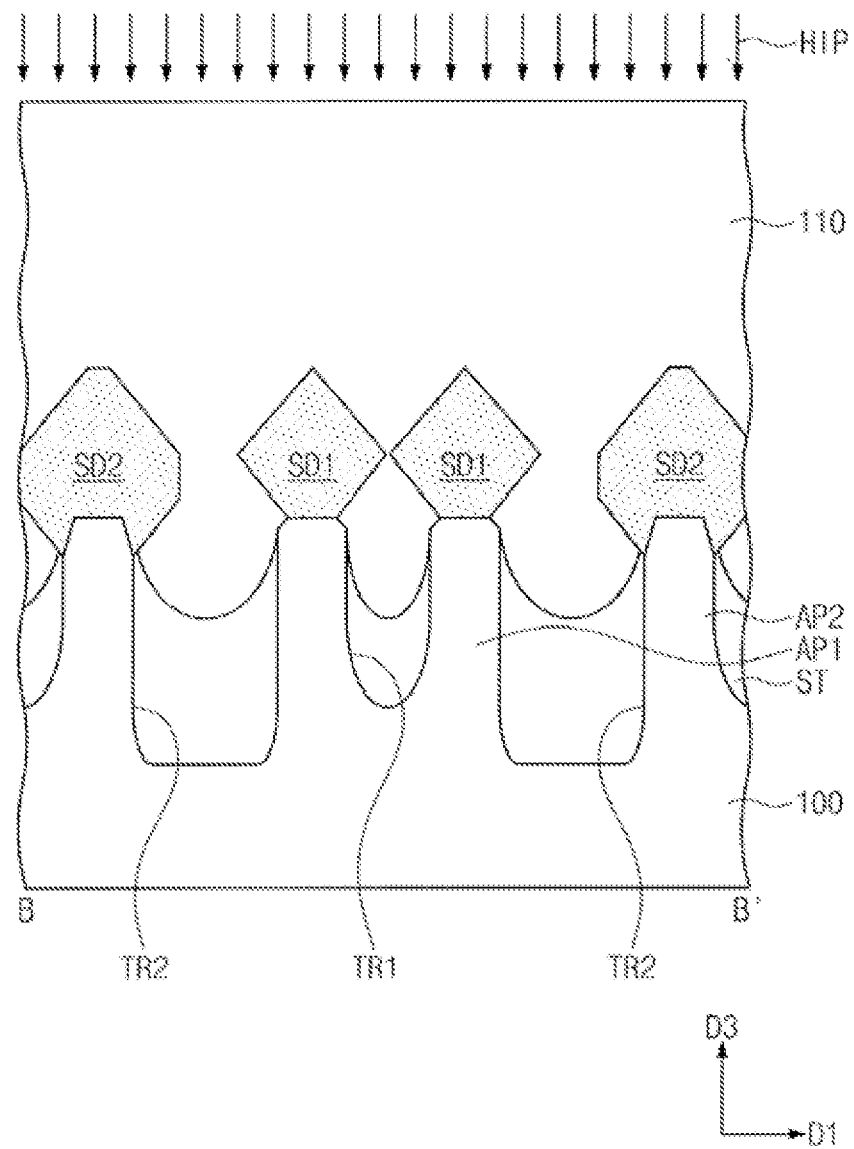
Figure 14C:
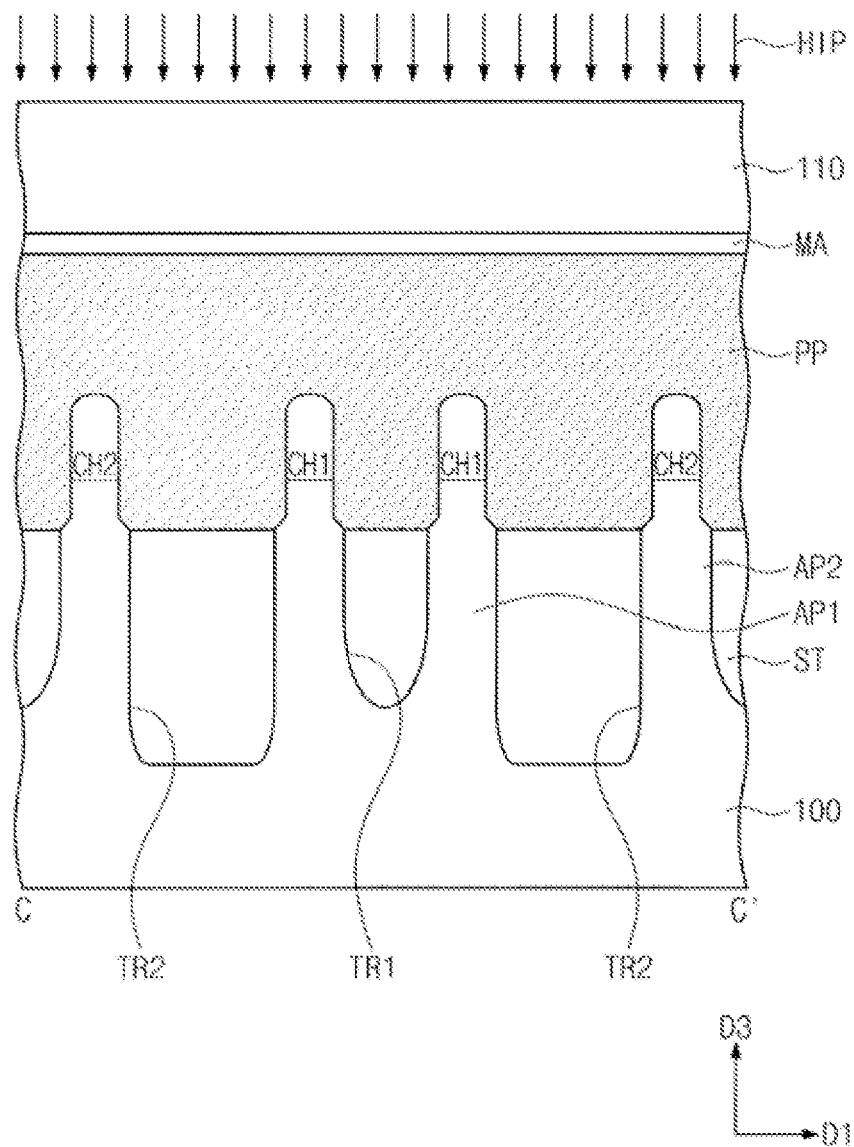
Figure 15:
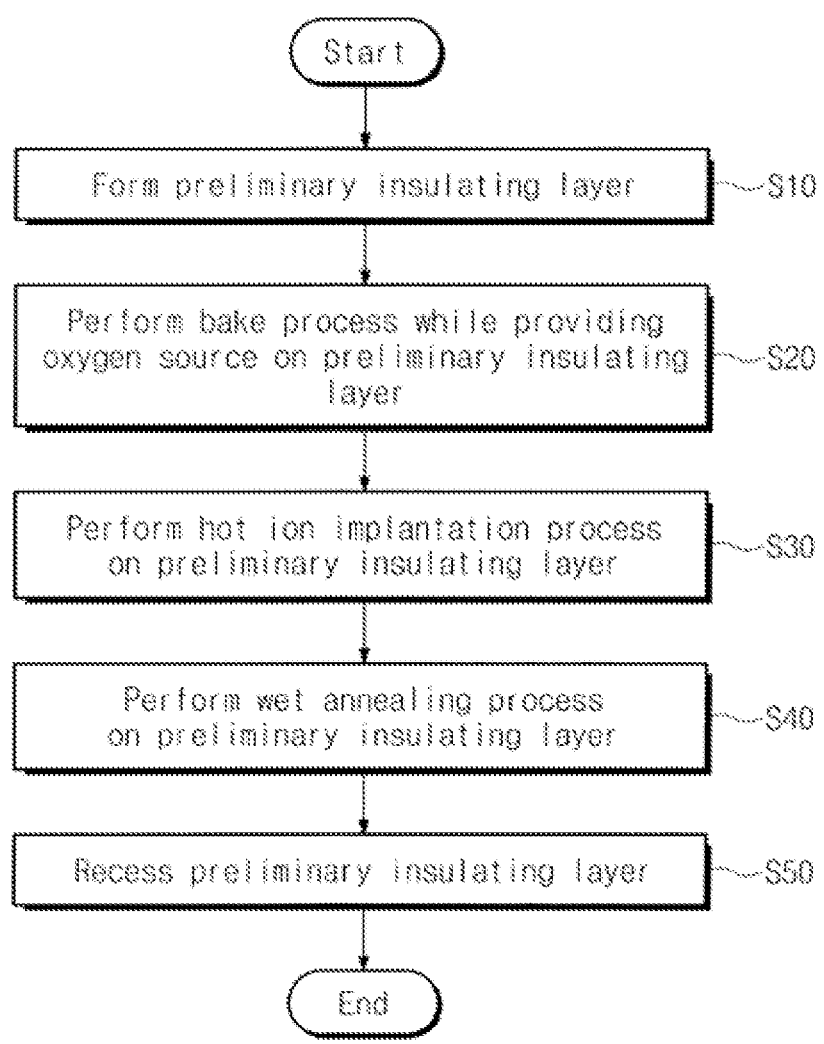
FIG. 15 illustrates a flow chart illustrating a method of forming a device isolation layer.

FIGS. 3, 5, 9, 11, and 13 are plan views illustrating a method of fabricating a semiconductor device according to an example embodiment. FIGS. 4A, 6A, 10A, 12A, and 14A are sectional views taken along lines A-A' of FIGS. 3, 5, 9, 11, and 13, respectively. FIGS. 4B, 6B, 10B, 12B, and 14B are sectional views taken along lines B-B' of FIGS. 3, 5, 9, 11, and 13, respectively. FIGS. 10C, 12C, and 14C are sectional views taken along lines C-C' of FIGS. 9, 11, and 13, respectively. FIGS. 7A and 8A are sectional views, which are taken along line A-A' of FIG. 5 and are presented to illustrate some steps in a process of forming a device isolation layer. FIGS. 7B and 8B are sectional views, which are taken along line B-B' of FIG. 5 and are presented to illustrate some steps in a process of forming a device isolation layer. FIG. 15 is a flow chart illustrating a method of forming a device isolation layer.

Figure 4A:
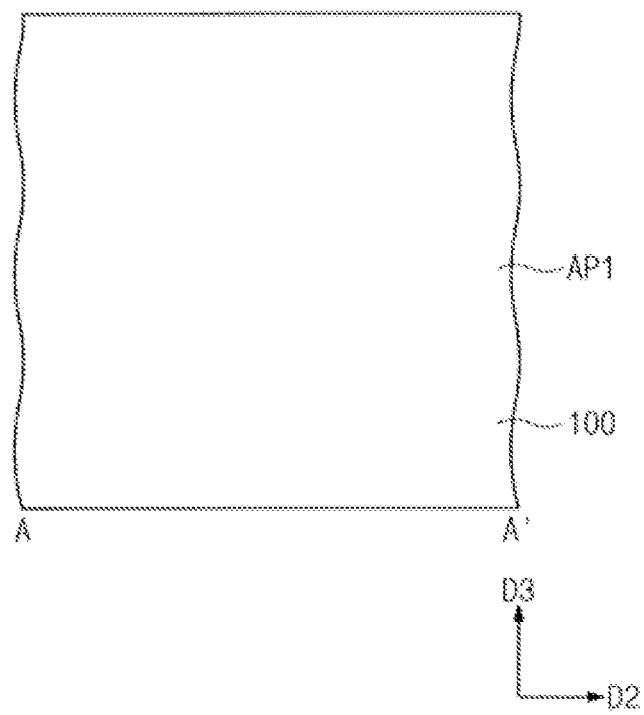
FIGS. 4A, 6A, 10A, 12A, and 14A illustrate sectional views taken along lines A-A' of FIGS. 3, 5, 9, 11, and 13, respectively.
Figure 4B:
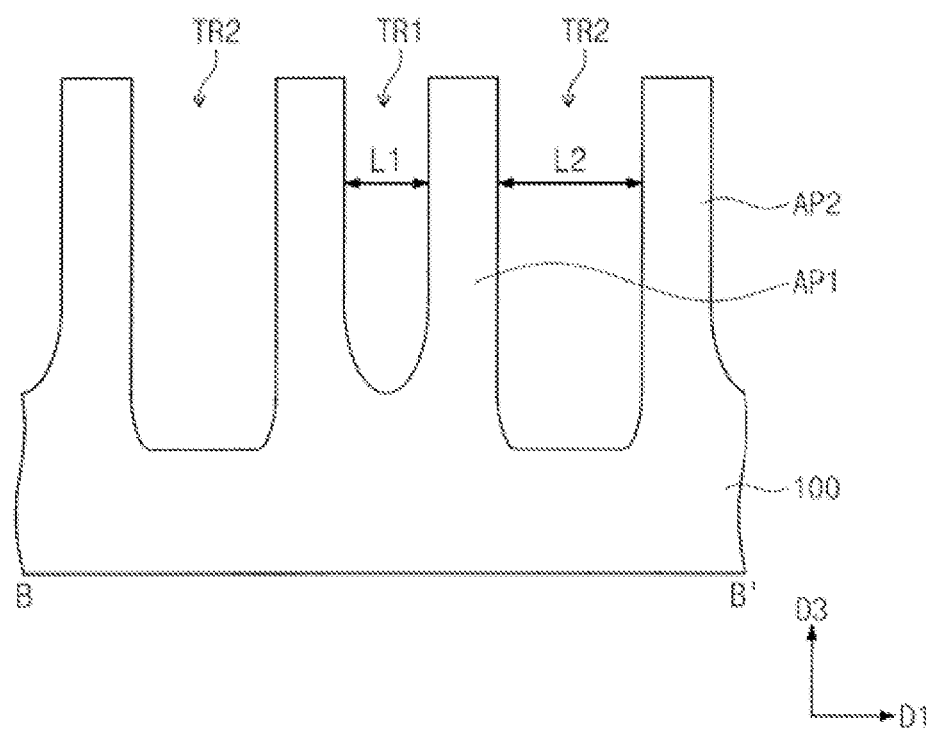
FIGS. 4B, 6B, 10B, 12B, and 14B illustrate sectional views taken along lines B-B' of FIGS. 3, 5, 9, 11, and 13, respectively.
Figure 5:
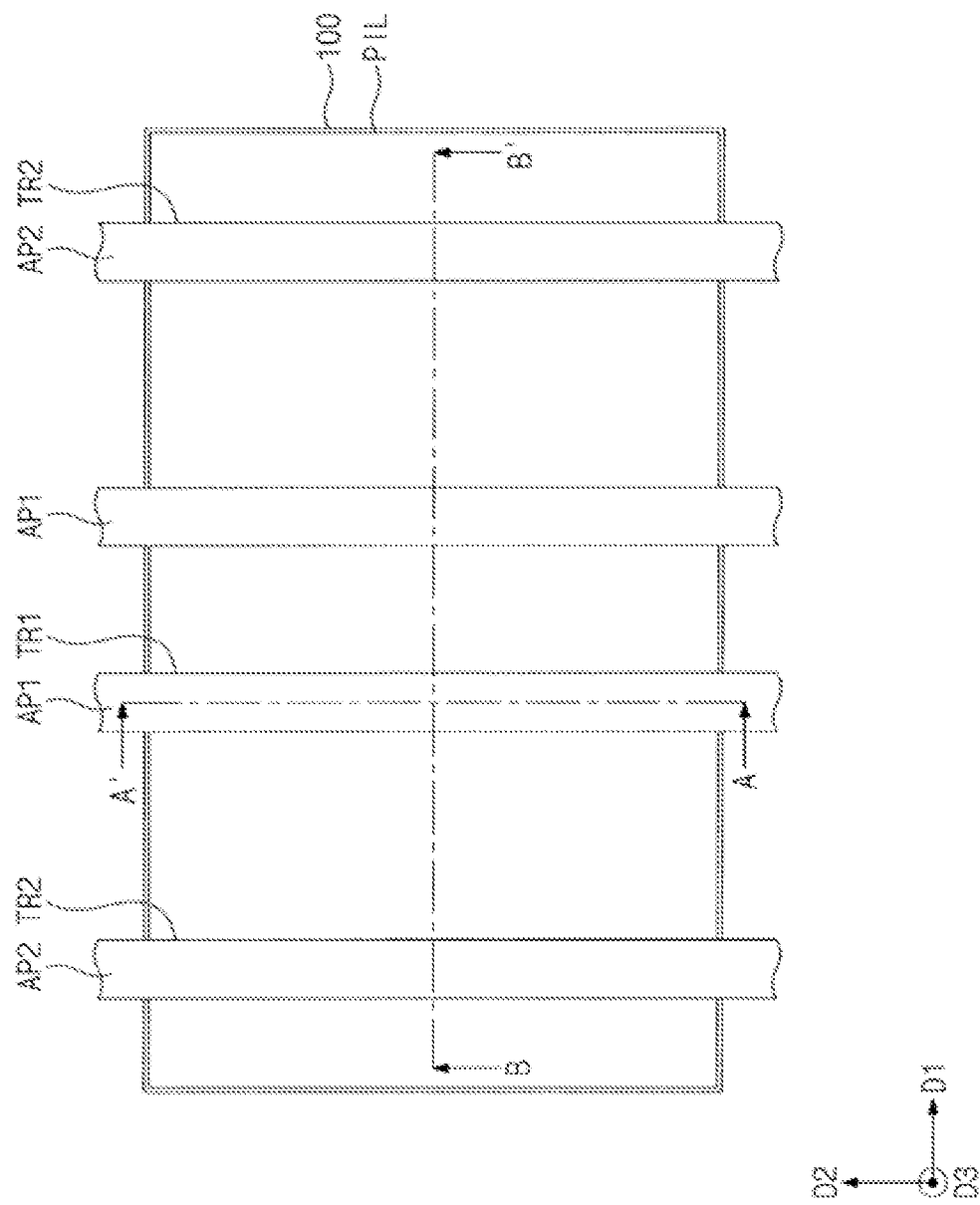
Figure 6A:
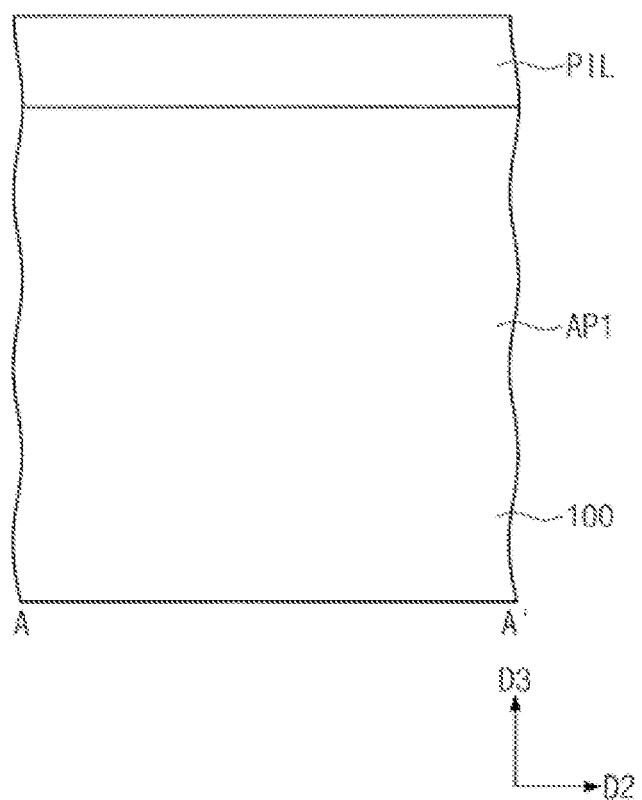
Figure 6B:
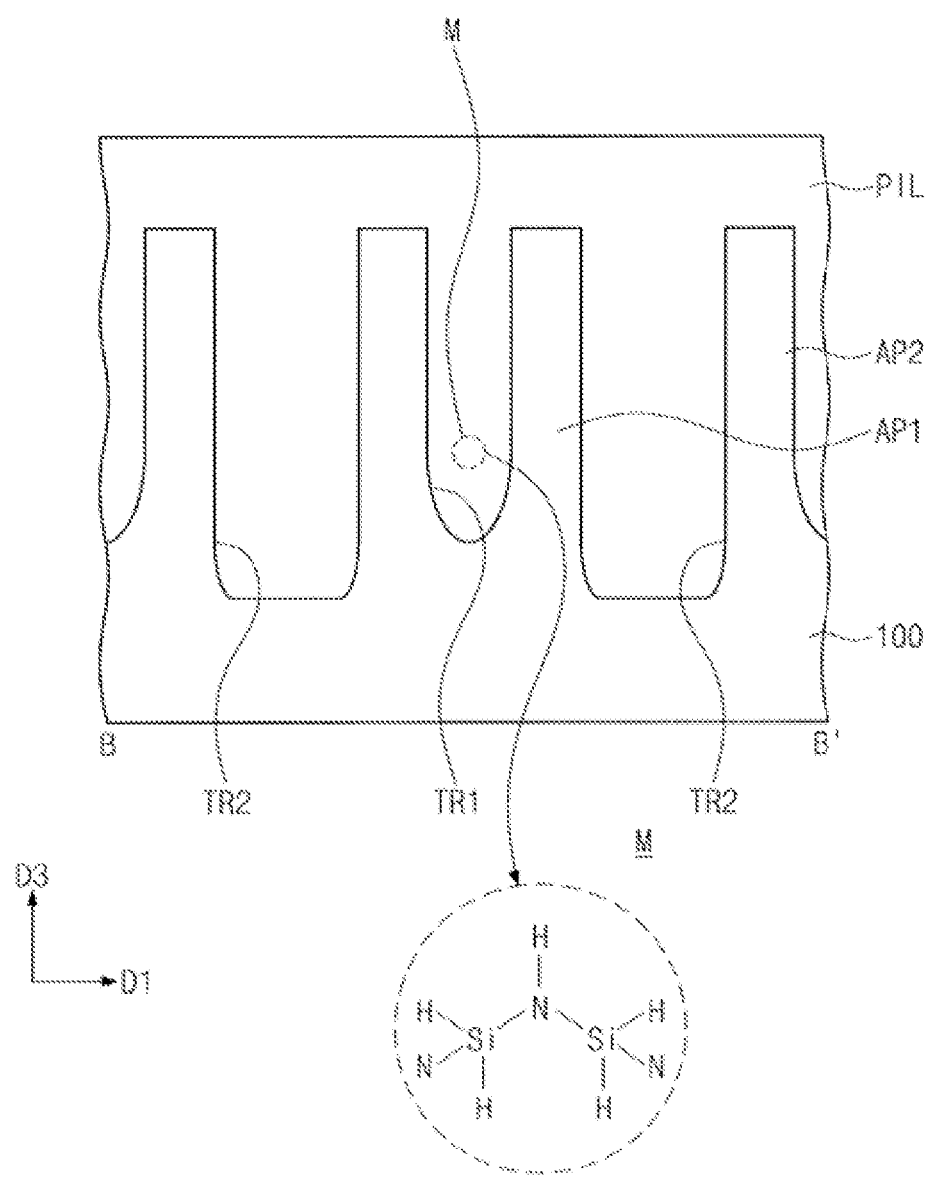

Referring to FIGS. 3, 4A, and 4B, the substrate 100 may be patterned to form the first and second active patterns AP1 and AP2. The substrate 100 may be a semiconductor substrate (e.g., of silicon, germanium, or silicon-germanium) or a compound semiconductor substrate. For example, the formation of the first and second active patterns AP1 and AP2 may include forming mask patterns on the substrate 100 and anisotropically etching the substrate 100 using the mask patterns as an etch mask.

The first trench TR1 may be formed between an adjacent pair of the first active patterns AP1. The second trench TR2 may be formed between the first and second active patterns AP1 and AP2 adjacent to each other. A distance between an adjacent pair of the first active patterns AP1 may be a first distance L1, and a distance between the first and second active patterns AP1 and AP2 adjacent to each other may be a second distance L2. The second distance L2 may be greater than the first distance L1. The second trench TR2 may be formed to have a depth greater than that of the first trench TR1. A width (e.g., W2 of FIG. 2C) of an upper portion of the second trench TR2 may be greater than a width (e.g., W1 of FIG. 2C) of an upper portion of the first trench TR1.

Referring to FIGS. 5, 6A, 6B, and 15, a preliminary insulating layer PIL may be formed on the substrate 100 to fill the first and second trenches TR1 and TR2 (in S10). The formation of the preliminary insulating layer PIL may be performed using, e.g., a low-pressure chemical vapor deposition (LPCVD) process, a plasma CVD process, or a flowable CVD (FCVD) process. In some example embodiments, the preliminary insulating layer PIL may be formed by a FCVD process. In the FCVD process, a flowable dielectric material may be used as a precursor for the preliminary insulating layer PIL. Thus, the first trench TR1 having a relatively small width may be completely filled with the preliminary insulating layer PIL.

The flowable dielectric material may include a silicon-containing precursor. The precursor may be formed of or include at least one selected from the group of silicate, siloxane, methyl silsesquioxane (MSQ), hydrogen silsesquioxane (HSQ), perhydropolysilazane (PSZ), tetraethyl orthosilicate (TEOS), and trisilylamine (TSA). As an example, perhydropolysilazane (PSZ) may be used as the precursor for forming the preliminary insulating layer PIL.

With regard to a chemical structure of a portion M of the preliminary insulating layer PIL, the preliminary insulating layer PIL may include a polymer having a repeating unit represented by $H_2Si$—NH (e.g., the polymer represented by $[H_2Si$—$NH]_n$, where n is an integer greater than or equal to 1). The preliminary insulating layer PIL may include Si—N, Si—H, and N—H bonds.

A bake process may be performed on the preliminary insulating layer PIL, and in this case, an oxygen source may be provided on the preliminary insulating layer PIL (in S20). The bake process may be performed at a first temperature. The first temperature may range from 100° C. to 500° C. The oxygen source may include oxygen ($O_2$) and/or ozone ($O_3$). Owing to the bake process, the oxygen source may be infiltrated into the preliminary insulating layer PIL. Thus, the bake process may cause an increase in oxygen content of the preliminary insulating layer PIL. In some example embodiments, the bake process and the process of providing the oxygen source may be omitted.

Referring to FIGS. 5, 7A, 7B, and 15, a hot ion implantation process HIP may be performed on the preliminary insulating layer PIL (in S30). The hot ion implantation process HIP may be performed at a second temperature. The second temperature may range from 100° C. to 600° C.

The hot ion implantation process HIP may be performed using a material (i.e., element) having a relatively small atomic weight. As an example, the hot ion implantation process HIP may be performed using at least one light species selected from the group of H, He, C, N, O, Si, Ar, Ge, Kr, and Xe. As another example, the hot ion implantation process HIP may be performed using at least one light species selected from the group of H, He, C, N, O, Ar, Kr, and Xe.

In an example embodiment, the chemical elements in group 13 (i.e., boron group) and the chemical elements in group 15 (i.e., pnictogen group) are not used in the hot ion implantation process HIP. This is because, if the chemical elements in groups 13 and 15 are injected into the first and second active patterns AP1 and AP2, electric characteristics of the first and second active patterns AP1 and AP2 may be affected by the chemical elements in groups 13 and 15.

In another example embodiment, nitrogen, which is one of the chemical elements in group 15 (i.e., pnictogen group), may have low reactivity, and thus, nitrogen may be used in the hot ion implantation process HIP.

In an example embodiment, the hot ion implantation process HIP may be performed using helium (He).

By controlling power of the hot ion implantation process HIP, an ion IO may be infiltrated into an inner portion of the preliminary insulating layer PIL that fills the first and second trenches TR1 and TR2. As an example, during the hot ion implantation process HIP, energy of the injected ion IO may range from 10 keV to 150 keV and dose of the injected ion IO may range from $1.00\ E13/cm^2$ to $1.00\ E17/cm^2$.

The ion IO may be injected into the preliminary insulating layer PIL and may be used to break at least one of Si—N, Si—H, and N—H bonds. For example, since the accelerated ion IO has a relatively high energy, the Si—N bond, the Si—H bond, or the N—H bond may be broken by collision with the ion IO, and nitrogen and hydrogen released by breaking of the Si—N, Si—H, and N—H bonds may be eliminated from the preliminary insulating layer PIL in the form of $NH_3$ and $H_2$.

As a result of the bake process and the oxygen source providing process, the oxygen content in the preliminary insulating layer PIL may be increased. A silicon atom formed by breaking the bond with the nitrogen atom may be bonded with an oxygen atom. A silicon atom formed by breaking the bond with the hydrogen atom may be bonded with an oxygen atom.

By using the hot ion implantation process HIP, the ion IO may be uniformly injected into the preliminary insulating layer PIL in the first trench TR1 having a relatively small width.

If the hot ion implantation process HIP were to be performed at a low temperature of 100° C. or lower, the Si—N, Si—H, and N—H bonds may not be broken by the ion IO. Furthermore, the ion IO may lead to an undesirable damage of the preliminary insulating layer PIL. Thus, the preliminary insulating layer PIL in the first trench TR1 may not be transformed to a silicon oxide layer, and defects may occur in the preliminary insulating layer PIL.

Referring to FIGS. 5, 8A, 8B, and 15, a wet annealing process WAN may be performed on the preliminary insulating layer PIL (in S40). The wet annealing process WAN may be performed at a third temperature to react the densified preliminary insulating layer PIL with water. The third temperature may range from 100° C. to 900° C. The wet annealing process WAN may be performed using $H_2O$, $H_2O_2$, $O_2$, and/or $O_3$. As a result of the wet annealing process WAN, oxygen atoms may be infiltrated into the preliminary insulating layer PIL and may be bonded with silicon atoms. As discussed above, the polymer of the preliminary insulating layer PIL may include $H_2Si$—NH moieties, which moieties, by reaction with water ($H_2O$) in the wet annealing process WAN, are converted to silicon oxide ($SiO_2$) while eliminating ammonia ($NH_3$) and hydrogen ($H_2$). Thus, the preliminary insulating layer PIL may be transformed to a silicon oxide layer ($SiO_2$) preliminary insulating layer PIL using the wet annealing process WAN.

Figure 28:
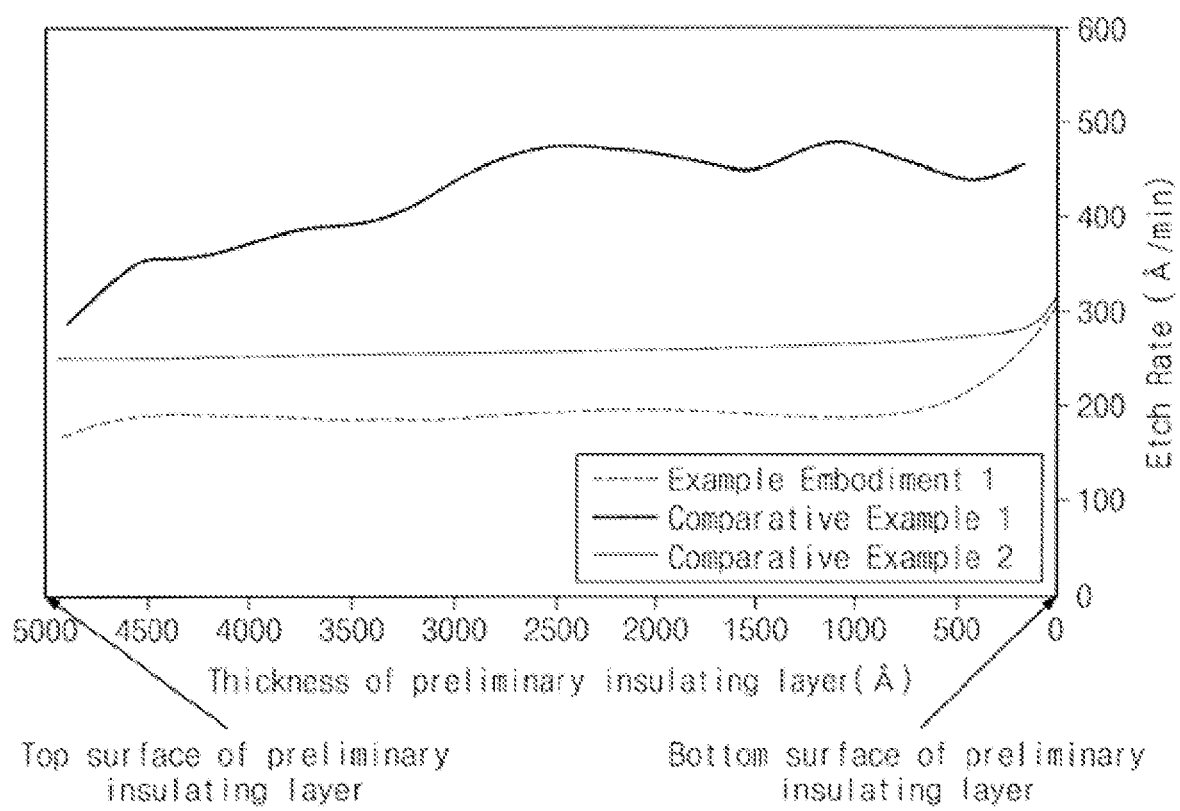
FIG. 28 illustrates a graph showing a change in etch rate of an oxide layer, which is caused by a hot ion implantation process.

FIG. 28 is a graph showing a change in etch rate of an oxide layer caused by a hot ion implantation process.

A flowable chemical vapor deposition process (FCVD) using perhydropolysilazane (PSZ) was performed on a silicon wafer to form a preliminary insulating layer to a thickness of 5000 Å.

For Example Embodiment 1, a hot ion implantation process using helium (He) was performed on the preliminary insulating layer at a temperature of 500° C., and a wet annealing process was performed at a temperature of 600° C. to form an oxide layer from the preliminary insulating layer.

For Comparative Example 1, an ion implantation process using helium (He) was performed on the preliminary insulating layer at a room temperature of 25° C., and a wet annealing process was performed at a temperature of 600° C. to form an oxide layer from the preliminary insulating layer.

For Comparative Example 2, an ion implantation process was omitted, and only a wet annealing process was performed at a temperature of 600° C. to form an oxide layer from the preliminary insulating layer.

An etching process using hydrofluoric acid (HF) was performed on the oxide layers according to Example Embodiment 1 and Comparative Examples 1 and 2, and then, etch rates of the oxide layers summarized in FIG. 28 were measured.

Referring to FIG. 28, the etch rate of the oxide layer was lowest in the Example Embodiment 1 and highest in the Comparative Example 1. Thus, the oxide layer according to the Example Embodiment 1 had a low etch rate. Without being bound by theory, it is believed that the low etch rate was exhibited because the hot ion implantation process allows the oxide layer to have a defect-free or densified structure. Meanwhile, the oxide layer of the Comparative Example 1 had an etch rate higher than that of the oxide layer of the Comparative Example 2, from which the ion implantation process was omitted. Without being bound by theory, it is believed that this is because the preliminary insulating layer was damaged by the ion implantation process performed at the room temperature, thereby producing many defects in the oxide layer.

Referring again to FIGS. 5, 8A, 8B, and 15, if the first trench TR1 has a relatively small width, there may be a difficulty in effectively injecting oxygen atoms into the preliminary insulating layer PIL in the first trench TR1. In the case where the hot ion implantation process HIP (in S30) is not performed, the preliminary insulating layer PIL in the first trench TR1 may not be sufficiently reacted with oxygen atoms, and thus, Si—N, Si—H, and N—H bonds may remain as they are. Thus, the preliminary insulating layer PIL in the first trench TR1 may not be transformed to a silicon oxide ($SiO_2$) layer.

By contrast, in the method of forming the device isolation layer ST according to an example embodiment, the hot ion implantation process HIP may be performed to break Si—N, Si—H, and N—H bonds in the preliminary insulating layer PIL, which is provided in the first trench TR1, in advance. Thereafter, the wet annealing process WAN may be performed to completely transform the preliminary insulating layer PIL in the first trench TR1 to a silicon oxide layer. As a result, it may be possible to form a densified device isolation layer ST from the preliminary insulating layer PIL.

In the case where a high temperature wet annealing is performed to oxidize a flowable dielectric material filling the first and second trenches TR1 and TR2, a volume of the flowable dielectric material may be generally reduced, and thus, may exert a tensile stress to the first and second active patterns AP1 and AP2 adjacent thereto. As a result, the first and second active patterns AP1 and AP2 may be deformed. According to some example embodiments, the hot ion implantation process HIP is used in connection with oxidizing the flowable dielectric material. Thus, it may be possible to substantially prevent a change in volume of the flowable dielectric material. Thus, it may be possible to reduce a stress to be applied to the first and second active patterns AP1 and AP2 covered with the preliminary insulating layer PIL. For example, a compressive stress or a reduced tensile stress may be exerted to the first and second active patterns AP1 and AP2. As a result, it may be possible to prevent the first and second active patterns AP1 and AP2 from being deformed.

After the wet annealing process WAN, a dry annealing process may be performed. The dry annealing process may be performed at a temperature of about 1000° C., and nitrogen ($N_2$) may be used for the dry annealing process. The light species doped in the first and second active patterns AP1 and AP2 may be removed as a result of the wet annealing process WAN and the dry annealing process, while, in the preliminary insulating layer PIL, only some of the doped light species may be removed, and others of the doped light species may remain. As a result, a concentration of the light species in the preliminary insulating layer PIL may be higher than a concentration of the light species in the first and second active patterns AP1 and AP2.

Referring to FIGS. 9, 10A to 10C, and 15, the silicon oxide preliminary insulating layer PIL may be recessed to expose the upper portions of the first and second active patterns AP1 and AP2, and as a result, the silicon oxide device isolation layer ST may be formed (in S50). The upper portions of the first and second active patterns AP1 and AP2 may be partially etched during the recessing of the preliminary insulating layer PIL.

Sacrificial patterns PP may be formed to cross the first and second active patterns AP1 and AP2. The sacrificial patterns PP may be line-shaped patterns extending in the first direction D1. For example, the formation of the sacrificial patterns PP may include forming a sacrificial layer on the substrate 100, forming mask patterns MA on the sacrificial layer, and patterning the sacrificial layer using the mask patterns MA as an etch mask. The sacrificial layer may be formed of or include a poly-silicon layer.

A pair of the gate spacers GS may be formed on opposite sidewalls of each of the sacrificial patterns PP. The gate spacers GS may be formed on opposite sidewalls of each of the upper portions of the first and second active patterns AP1 and AP2. The formation of the gate spacers GS may include conformally forming a spacer layer on the substrate 100, and anisotropically etching the spacer layer. The spacer layer may be formed of or include at least one of $SiO_2$, SiCN, SiCON, or SiN. In some example embodiments, the spacer layer may be a multi-layered structure that is made of at least two of $SiO_2$, SiCN, SiCON, or SiN.

Referring to FIGS. 11 and 12A to 12C, the first and second source/drain patterns SD1 and SD2 may be formed at opposite sides of each of the sacrificial patterns PP. The first source/drain patterns SD1 may be formed on the upper portions of the first active patterns AP1, and the second source/drain patterns SD2 may be formed on the upper portions of the second active patterns AP2.

The first and second source/drain patterns SD1 and SD2 may be formed by, e.g., a selective epitaxial growth process, in which the substrate 100 may be used as a seed layer. As an example, the selective epitaxial growth process may include a chemical vapor deposition (CVD) process or a molecular beam epitaxy (MBE) process.

First, the first and second active patterns AP1 and AP2 may be selectively etched at opposite sides of each of the sacrificial patterns PP. During the etching of the first and second active patterns AP1 and AP2, an upper portion of the device isolation layer ST may be partially etched. A portion of the device isolation layer ST located below the sacrificial patterns PP may not be etched.

The first and second source/drain patterns SD1 and SD2 may be respectively formed using the etched first and second active patterns AP1 and AP2 as a seed layer. As a result of the formation of the first source/drain patterns SD1, a first channel CH1 may be defined between a pair of the first source/drain patterns SD1. As a result of the formation of the second source/drain patterns SD2, a second channel CH2 may be defined between a pair of the second source/drain patterns SD2.

Referring to FIGS. 13 and 14A to 14C, the first interlayer insulating layer 110 may be formed to cover the first and second source/drain patterns SD1 and SD2, the gate spacers GS, and the mask patterns MA. As an example, the first interlayer insulating layer 110 may be formed of or include a silicon oxide layer.

Another hot ion implantation process HIP (e.g., substantially the same as the hot implantation process HIP described above in connection with operation S30) may be performed on the first interlayer insulating layer 110. The hot ion implantation process HIP may provide the first interlayer insulating layer 110 with an increased density. For example, the hot ion implantation process HIP may be performed to prevent a void from being formed in the first interlayer insulating layer 110 between the sacrificial patterns PP.

Referring back to FIGS. 1 and 2A to 2C, the first interlayer insulating layer 110 may be planarized to expose top surfaces of the sacrificial patterns PP. The planarization of the first interlayer insulating layer 110 may be performed using, e.g., an etch-back or chemical-mechanical polishing (CMP) process. As a result, the first interlayer insulating layer 110 may have a top surface that is substantially coplanar with exposed top surfaces of the sacrificial patterns PP, and the top surfaces of the gate spacers GS may be formed to be coplanar with the top surfaces of the sacrificial patterns PP.

The sacrificial patterns PP may be replaced with the gate electrodes GE and the insulating pattern IL. For example, an anisotropic etching process may be performed on the exposed sacrificial patterns PP. The anisotropic etching process may be performed to selectively remove only the sacrificial patterns PP. The insulating pattern IL may be formed in part of the empty spaces formed by removing the sacrificial patterns PP. The gate dielectric patterns GI and the gate electrodes GE may be formed in the remaining regions of the empty spaces, except for the insulating pattern IL.

The gate dielectric patterns GI may be conformally formed by, e.g., an atomic layer deposition (ALD) process or a chemical oxidation process. As an example, the gate dielectric pattern GI may be formed of or include a high-k dielectric material. The gate electrodes GE may be formed by forming a gate electrode layer on the gate dielectric patterns GI and planarizing the gate electrode layer. As an example, the gate electrode layer may be formed of or include at least one of conductive metal nitrides or metallic materials.

Upper portions of the gate electrodes GE may be selectively etched to recess the gate electrodes GE. The recessed top surfaces of the gate electrodes GE may be lower than the top surface of the first interlayer insulating layer 110 and the top surfaces of the gate spacers GS. The gate capping patterns GP may be formed on the recessed gate electrodes GE. The formation of the gate capping patterns GP may include forming a gate capping layer to cover the recessed gate electrodes GE and planarizing the gate capping layer to expose the top surface of the first interlayer insulating layer 110. As an example, the gate capping layer may be formed of or include at least one of SiON, SiCN, SiCON, or SiN.

The second interlayer insulating layer 120 may be formed on the first interlayer insulating layer 110 to cover the gate capping patterns GP. The active contacts AC may be formed to penetrate the second interlayer insulating layer 120 and the first interlayer insulating layer 110 and may be coupled to the first and second source/drain patterns SD1 and SD2. The gate contacts GC may be formed to penetrate the second interlayer insulating layer 120 and the gate capping patterns GP and may be connected to the gate electrodes GE. The formation of the active contacts AC and gate contacts GC may include forming holes to define positions and shapes of the active contacts AC and gate contacts GC and forming a conductive layer to fill the holes. The conductive layer may be formed of or include at least one of metal nitrides or metallic materials.

Figure 16:
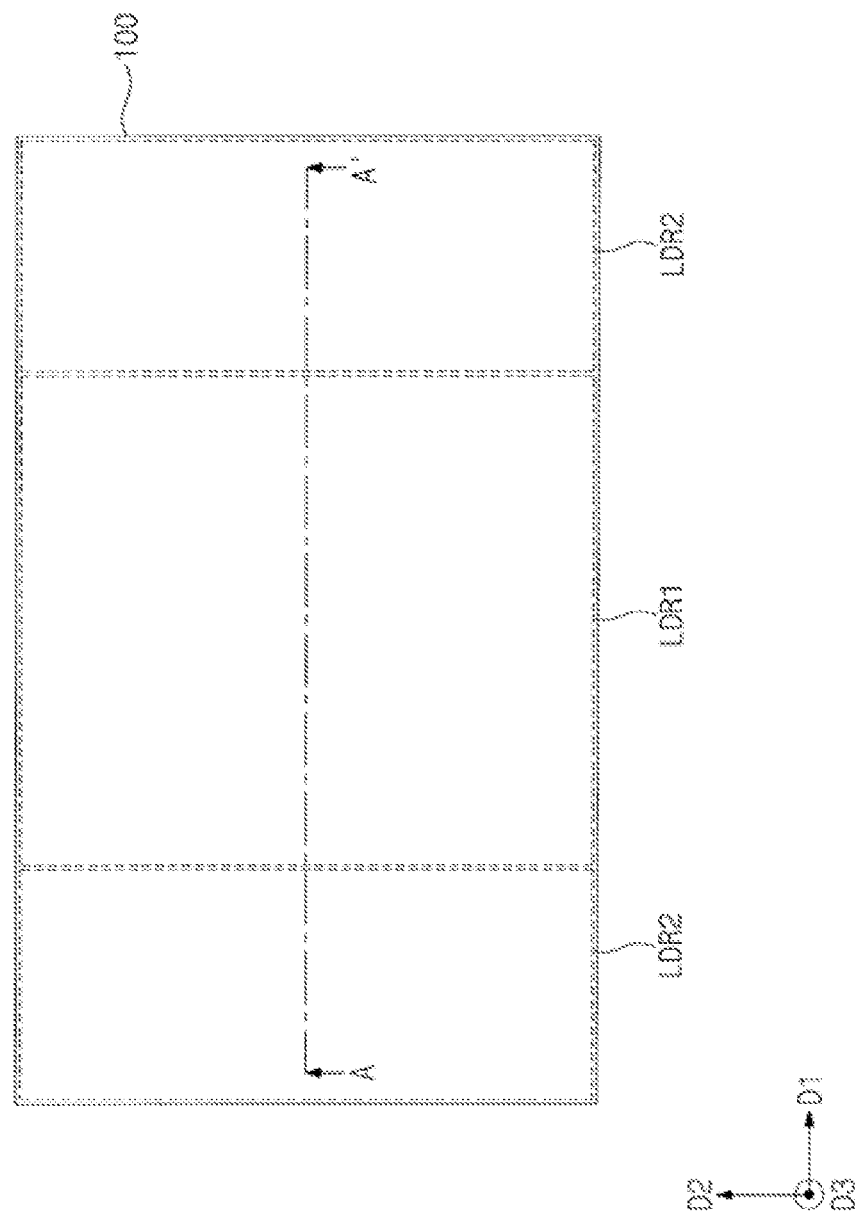
FIGS. 16 and 18 illustrate plan views illustrating a method of fabricating a semiconductor device, according to an example embodiment.
Figure 17:
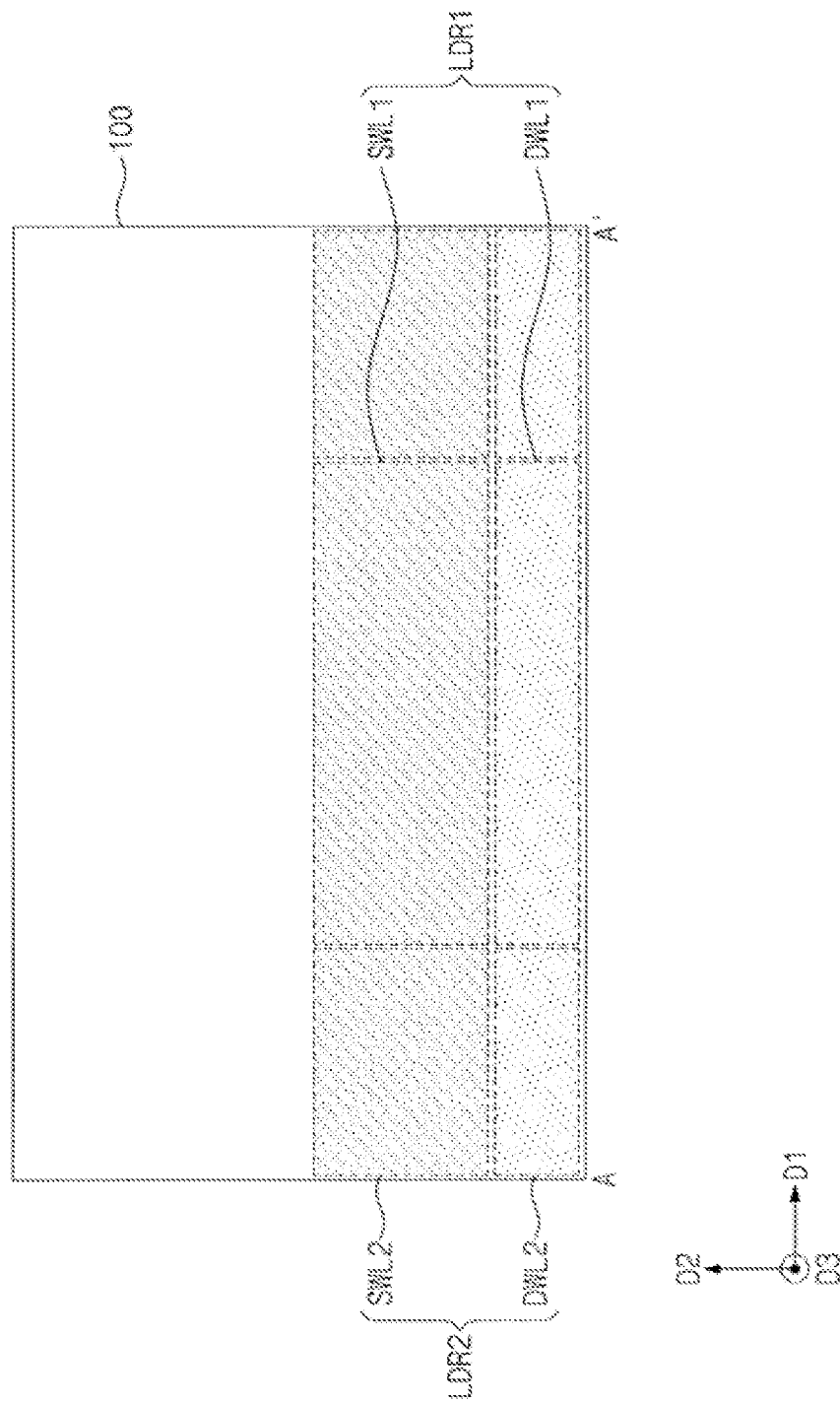
FIGS. 17 and 19A illustrate sectional views taken along lines A-A' of FIGS. 16 and 18, respectively.
Figure 18:
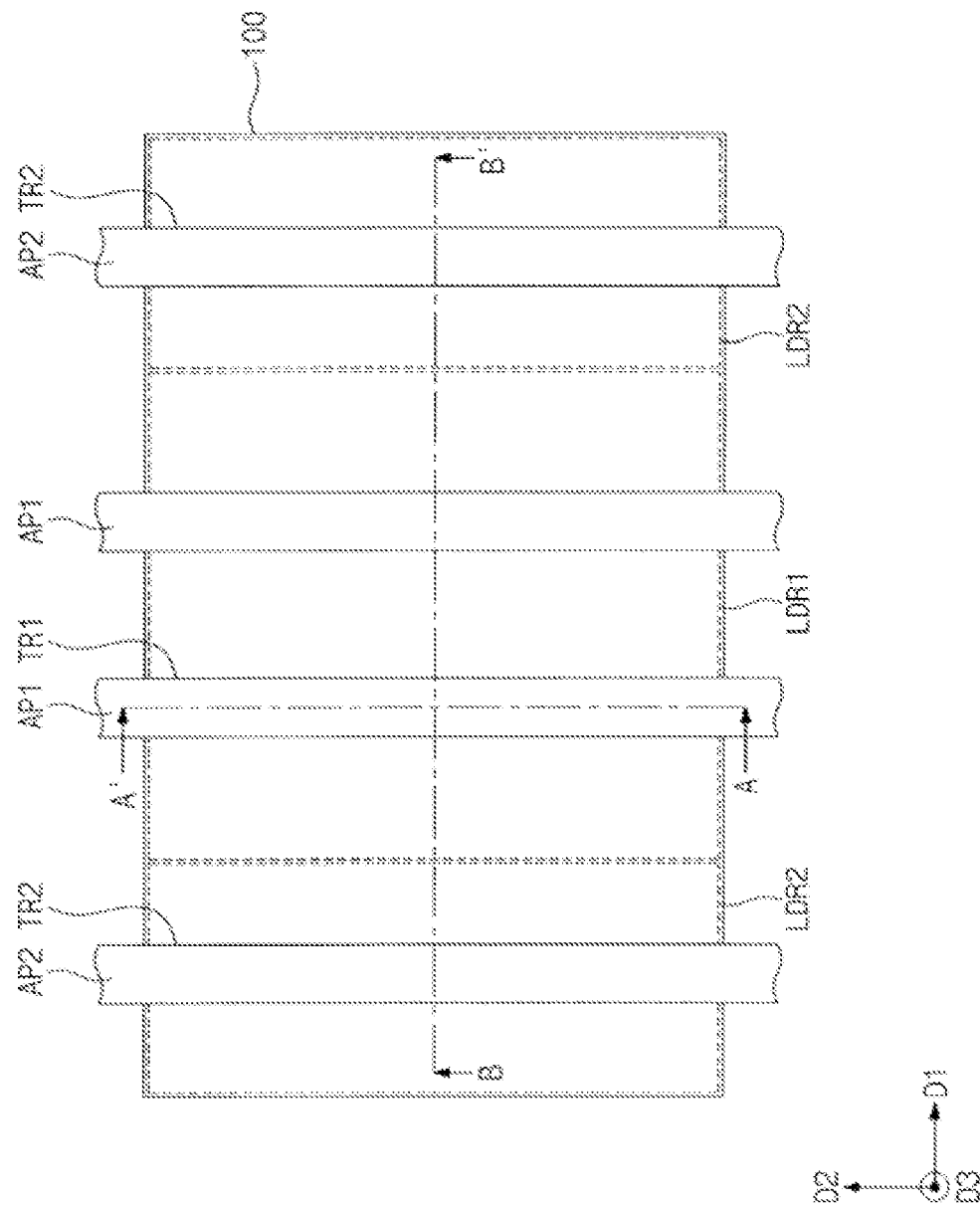
Figure 19A:
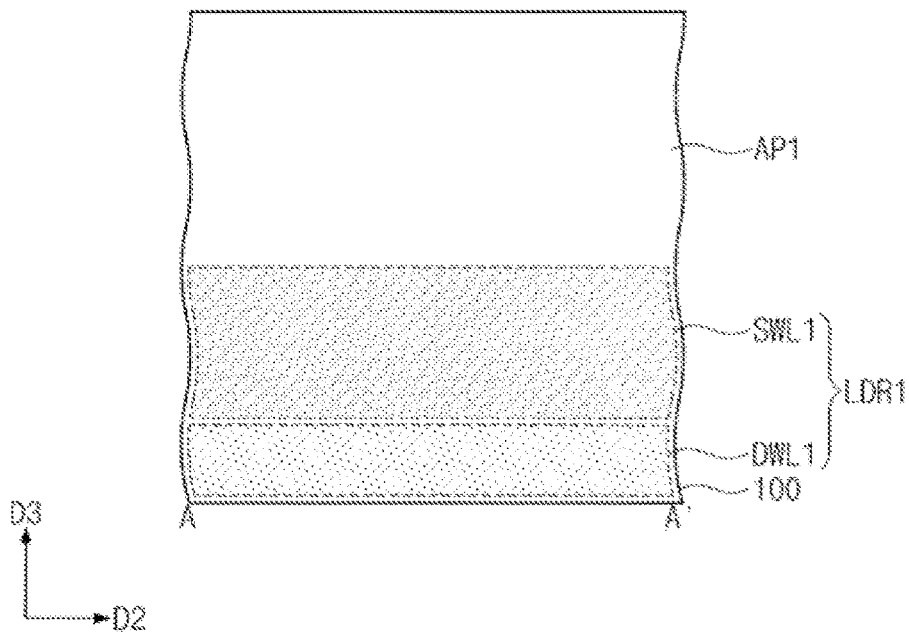
Figure 19B:
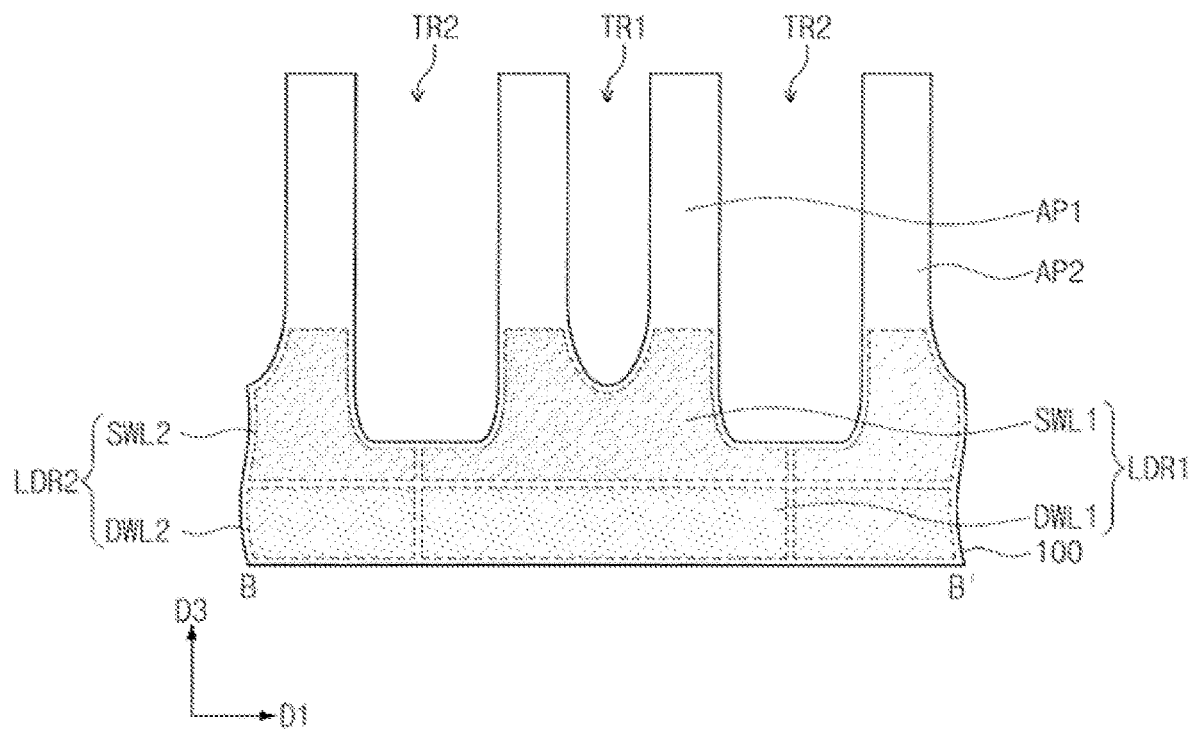
FIG. 19B illustrates a sectional view taken along line B-B' of FIG. 18.

FIGS. 16 and 18 are plan views illustrating a method of fabricating a semiconductor device, according to an example embodiment. FIGS. 17 and 19A are sectional views taken along lines A-A' of FIGS. 16 and 18, respectively. FIG. 19B is a sectional view taken along line B-B' of FIG. 18.

In the following description, an element previously described with reference to FIGS. 3 to 15, may be identified by the same reference number without repeating an overlapping description thereof.

Referring to FIGS. 16 and 17, a high energy ion implantation process on the substrate 100 may be performed to form a first lower impurity region LDR1 and a second lower impurity region LDR2. PMOSFETs may be formed on the first lower impurity region LDR1 through a subsequent process, and NMOSFETs may be formed on the second lower impurity region LDR2 through a subsequent process.

The formation of the first lower impurity region LDR1 may include forming a first deep well region DWL1 in a region for the PMOSFETs and forming a first shallow well region SWL1 on the first deep well region DWL1. For example, a first mask layer (not shown) may be formed on the substrate 100 to define a position or a shape of a region, in which the first lower impurity region LDR1 will be formed. The first mask layer may be formed to expose the region for the first lower impurity region LDR1. A first ion implantation process may be performed to form the first deep well region DWL1. A second ion implantation process may be performed to form the first shallow well region SWL1 on the first deep well region DWL1. The first and second implantation processes may be performed using impurities such as phosphorus (P), antimony (Sb), or arsenic (As).

The formation of the second lower impurity region LDR2 may include forming a second deep well region DWL2 in a region for the NMOSFETs and forming a second shallow well region SWL2 on the second deep well region DWL2. For example, a second mask layer (not shown) may be formed on the substrate 100 to define a position or a shape of a region, in which the second lower impurity region LDR2 will be formed. The second mask layer may be formed to expose the region for the second lower impurity region LDR2. A third ion implantation process may be performed to form the second deep well region DWL2. The fourth ion implantation process may be performed to form the second shallow well region SWL2 on the second deep well region DWL2. The third and fourth ion implantation processes may be performed using impurities, such as boron (B), gallium (Ga), or indium (In).

When the first to fourth ion implantation processes are performed, the annealing process may be performed. As a result of the annealing process, impurities in the first and second lower impurity regions LDR1 and LDR2 may be diffused. The annealing process may be performed using one of low temperature soak annealing, flash lamp annealing, laser annealing, and spike annealing processes.

Referring to FIGS. 18, 19A, and 19B, the substrate 100 provided with the first and second lower impurity regions LDR1 and LDR2 may be patterned to form the first and second active patterns AP1 and AP2. The first and second active patterns AP1 and AP2 may be formed on the first and second lower impurity regions LDR1 and LDR2, respectively.

Subsequent processes may be performed in substantially the same manner as that of the previous embodiments described with reference to FIGS. 5 to 15. For example, the preliminary insulating layer PIL may be formed and converted to silicon oxide and patterned to form the device isolation layer ST containing silicon oxide.

If the preliminary insulating layer PIL were to be oxidized by a high temperature annealing process at a temperature of 800° C. or higher, there may be an impurity-intermixing issue between the first deep well region DWL1, the first shallow well region SWL1, the second deep well region DWL2, and the second shallow well region SWL2. In the present example embodiment, the hot ion implantation process HIP may be performed at a temperature of about 100° C.-600° C. Thus, it may be possible to effectively oxidize the preliminary insulating layer PIL without the impurity intermixing issue between the impurity regions.

If the above-described first to fourth ion implantation processes were to be performed after the formation of the first and second active patterns AP1 and AP2, lattice defects (e.g., stacking faults) could occur in the first and second active patterns AP1 and AP2, due to the high energy condition in the first to fourth ion implantation processes. In the present example embodiment, the first and second lower impurity regions LDR1 and LDR2 may be formed in the substrate 100 by performing the first to fourth ion implantation processes before the formation of the first and second active patterns AP1 and AP2. Thus, even when the first to fourth ion implantation processes are performed under the high energy condition, it may be possible to prevent the lattice defects from occurring in the first and second active patterns AP1 and AP2.

If the device isolation layer ST were to be formed by the wet annealing process WAN without the above-described hot ion implantation process HIP (in S30) to completely oxidize the preliminary insulating layer PIL, it may then be necessary to increase a process temperature of the wet annealing process WAN, e.g., to a temperature that is higher than 900° C., in which case impurities in the first and second lower impurity regions LDR1 and LDR2 could diffuse so as to deteriorate a junction isolation property between the first and second lower impurity regions LDR1 and LDR2. In the present example embodiment, the hot ion implantation process HIP (in S30) is performed before the wet annealing process WAN. Thus, the preliminary insulating layer PIL may be completely oxidized using the wet annealing process WAN performed at a relatively low temperature (ranging from 100° C. to 900° C.). The wet annealing process WAN may be performed at a relatively low temperature, thus helping to avoid deterioration of a junction isolation property between the first and second lower impurity regions LDR1 and LDR2.

Figure 20:
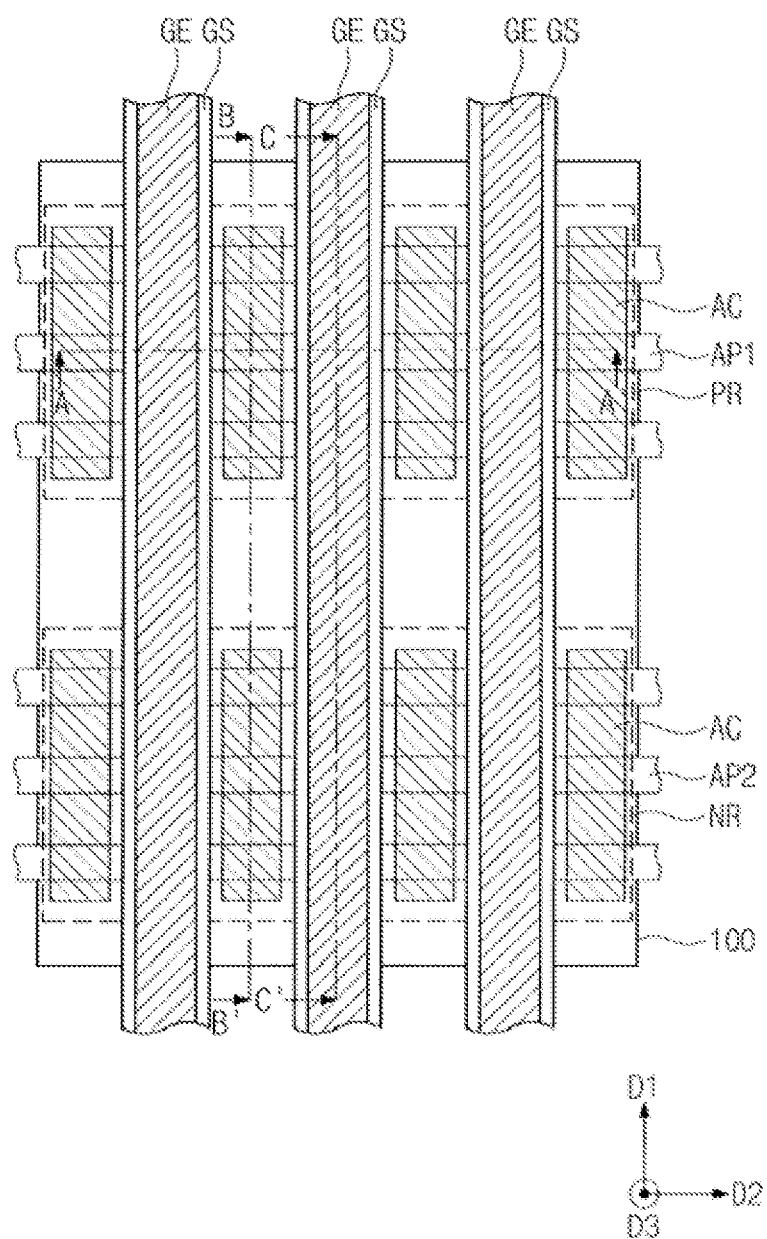
FIG. 20 illustrates a plan view illustrating a semiconductor device according to an example embodiment.
Figure 21A:
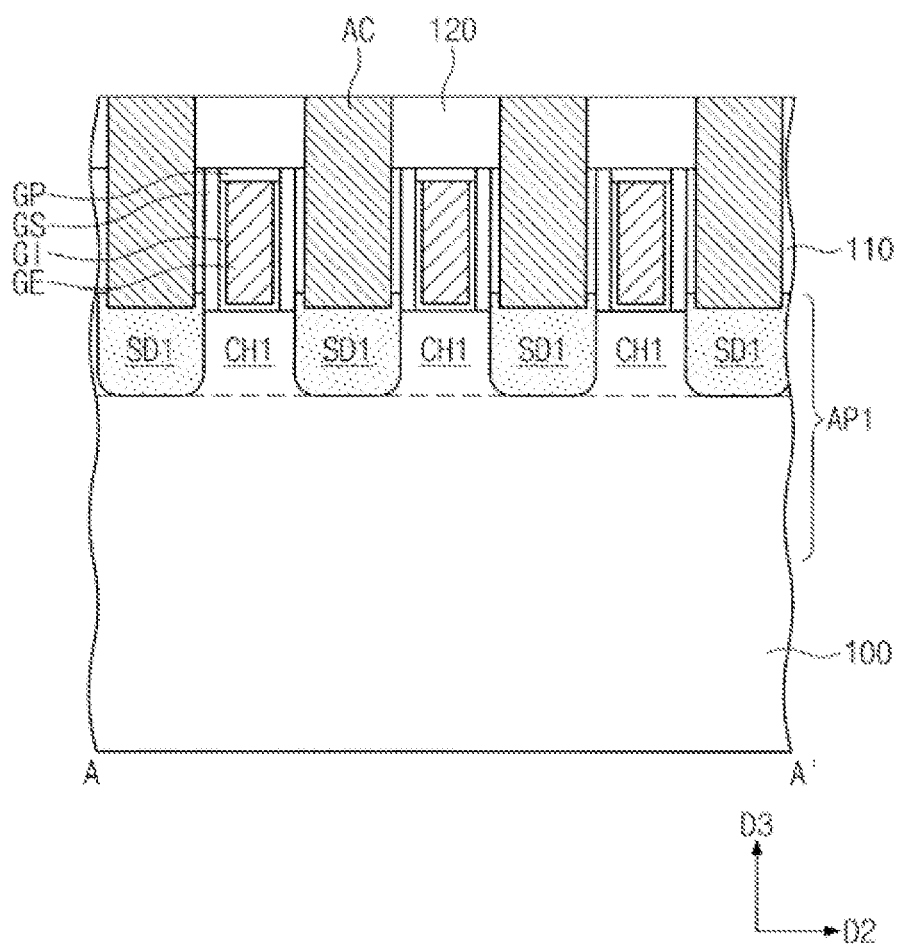
FIGS. 21A to 21C illustrate sectional views taken along lines A-A', B-B', and C-C', respectively, of FIG. 20.
Figure 21B:
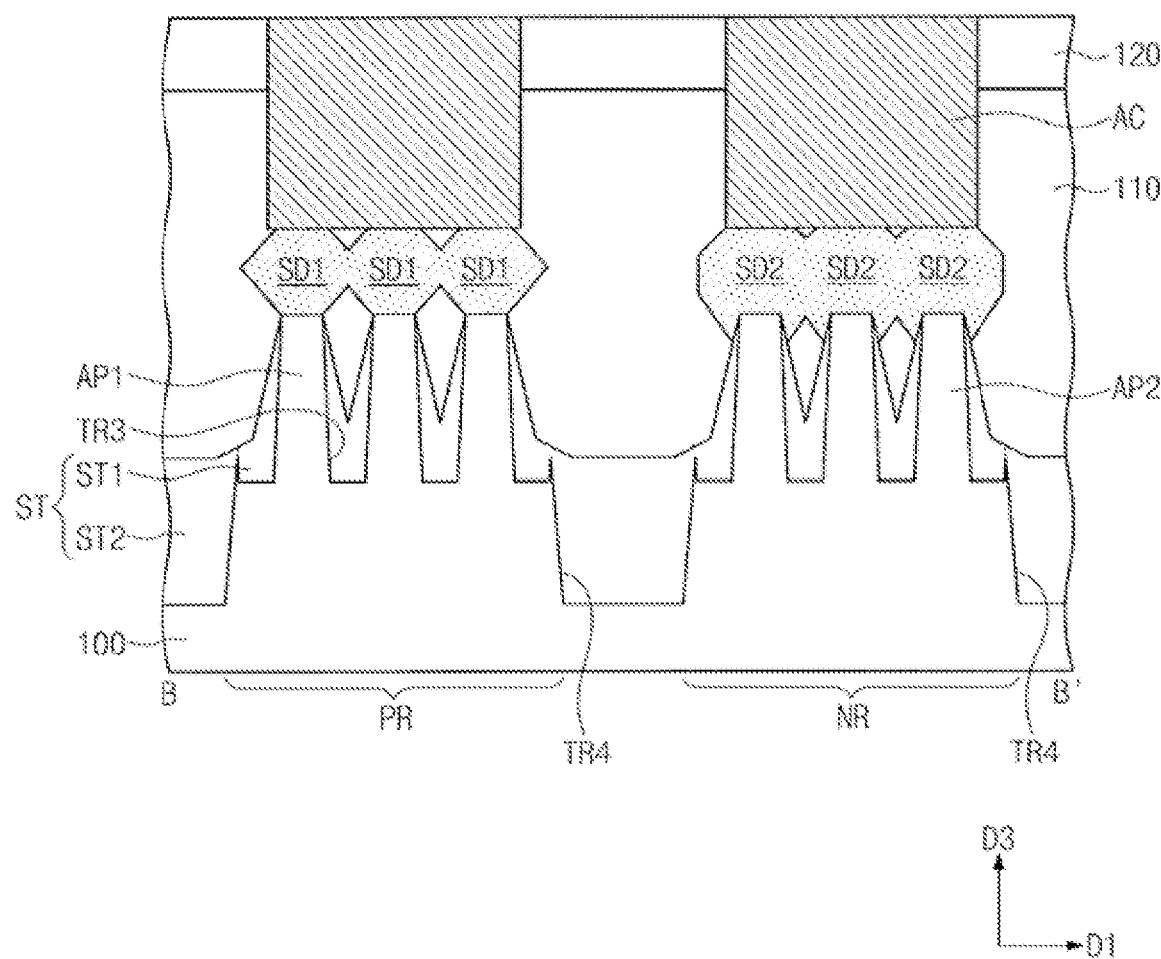
Figure 21C:
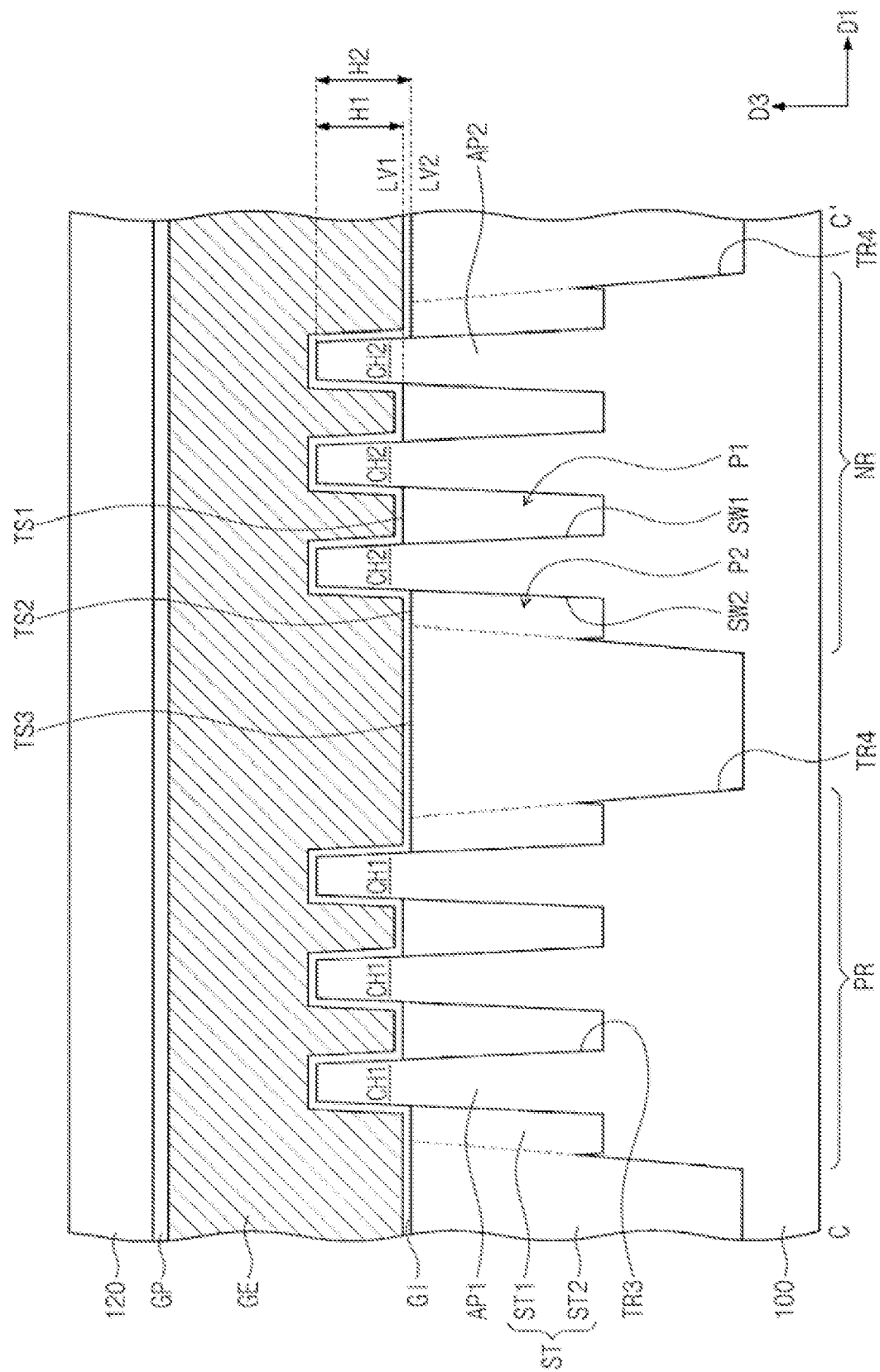

FIG. 20 is a plan view illustrating a semiconductor device according to an example embodiment. FIGS. 21A to 21C are sectional views taken along lines A-A', B-B', and C-C', respectively, of FIG. 20.

In the following description, an element previously described with reference to FIG. 1 and FIGS. 2A to 2C, may be identified by the same reference number without repeating an overlapping description thereof.

Referring to FIGS. 20 and 21A to 21C, at least one logic cell may be provided on the substrate 100. Logic transistors constituting the logic circuit of the semiconductor device may be disposed in the logic cell. As an example, logic transistors constituting a processor core or an I/O terminal may be provided on a logic cell region of the substrate 100.

The substrate 100 may include a PMOSFET region PR and an NMOSFET region NR. The PMOSFET region PR and the NMOSFET region NR may be defined by a fourth trench TR4, which is formed in an upper portion of the substrate 100. Thus, the fourth trench TR4 may be formed between the PMOSFET region PR and the NMOSFET region NR. The PMOSFET region PR and the NMOSFET region NR may be spaced apart from each other in the first direction D1 with the fourth trench TR4 interposed therebetween. The PMOSFET region PR and the NMOSFET region NR may extend in the second direction D2 crossing the first direction D1.

A plurality of active patterns AP1 and AP2 may be provided on the PMOSFET region PR and the NMOSFET region NR to extend in the second direction D2. The active patterns AP1 and AP2 may include the first active patterns AP1 on the PMOSFET region PR and the second active patterns AP2 on the NMOSFET region NR. The first and second active patterns AP1 and AP2 may be portions (e.g., vertically protruding portions) of the substrate 100. A third trench TR3 may be defined between adjacent ones of the first active patterns AP1 and between adjacent ones of the second active patterns AP2.

The device isolation layer ST may be provided to fill the third and fourth trenches TR3 and TR4. The device isolation layer ST may include a first device isolation layer ST1 filling the third trench TR3 and a second device isolation layer ST2 filling the fourth trench TR4. The first and second device isolation layers ST1 and ST2 may be formed of or include the same insulating material (e.g., silicon oxide). Thus, the first and second device isolation layers ST1 and ST2 may be connected to each other, thereby constituting a single isolation structure (e.g., the device isolation layer ST). The upper portions of the first and second active patterns AP1 and AP2 may extend in a vertical direction, thereby having a protruding shape relative to the first device isolation layer ST1.

The second device isolation layer ST2 may be deeper than the first device isolation layer ST1. For example, a level of a bottom surface of the second device isolation layer ST2 may be lower than a level of a bottom surface of the first device isolation layer ST1.

The first device isolation layer ST1, which is positioned below the gate electrode GE to be described below, may include a first portion P1 and a second portion P2. For example, the first portion P1 may be a portion of the first device isolation layer ST1 provided on a first sidewall SW1 of the second active pattern AP2, and the second portion P2 may be another portion of the first device isolation layer ST1 provided on a second sidewall SW2 of the second active pattern AP2. The second sidewall SW2 may be opposite to the first sidewall SW1.

The first portion P1 may be interposed between a pair of the second active patterns AP2, and the second portion P2 may be interposed between the second device isolation layer ST2 and the second active pattern AP2. The first portion P1 may have a first top surface TS1, and the second portion P2 may have a second top surface TS2. The first top surface TS1 may be positioned at a first level LV1, and the second top surface TS2 may be positioned at a second level LV2. The first level LV1 and the second level LV2 may be different from each other. As an example, the first level LV1 may be higher than the second level LV2. The second device isolation layer ST2 below the gate electrode GE may have a third top surface TS3. The third top surface TS3 may be positioned at the same level (e.g., the second level LV2) as the second top surface TS2.

The second active pattern AP2 (or the second channel CH2) below the gate electrode GE may have a first height H1 from the first top surface TS1. The first height H1 may be a vertical distance between a top surface of the second active pattern AP2 and the first top surface TS1. The second active pattern AP2 (or the second channel CH2) below the gate electrode GE may have a second height H2 from the second top surface TS2. The second height H2 may be a vertical distance between the top surface of the second active pattern AP2 and the second top surface TS2. The second height H2 may be greater than the first height H1.

The first channels CH1 and the first source/drain patterns SD1 may be provided in or on the upper portions of the first active patterns AP1. The second channels CH2 and the second source/drain patterns SD2 may be provided in or on the upper portions of the second active patterns AP2. The first source/drain patterns SD1 may be p-type impurity regions. The second source/drain patterns SD2 may be n-type impurity regions. The first and second source/drain patterns SD1 and SD2 may be epitaxial patterns, which may be formed using a selective epitaxial growth process.

The gate electrodes GE may be provided to cross the first and second active patterns AP1 and AP2 and to extend in the second direction D2. The gate electrodes GE may be spaced apart from each other in the first direction D1. As an example, the gate electrodes GE may be formed of or include at least one of conductive metal nitrides or metallic materials. A pair of the gate spacers GS may be respectively provided on the opposite sidewalls of each of the gate electrodes GE. The gate dielectric patterns GI may be interposed between the gate electrodes GE and the first and second active patterns AP1 and AP2. The gate capping pattern GP may be provided on each of the gate electrodes GE.

The first interlayer insulating layer 110 may be provided on the substrate 100. The first interlayer insulating layer 110 may cover the gate spacers GS and the first and second source/drain patterns SD1 and SD2. The second interlayer insulating layer 120 may be provided on the first interlayer insulating layer 110 to cover the top surfaces of the gate capping patterns GP and the top surfaces of the gate spacers GS.

The active contacts AC may be provided at the opposite sides of each of the gate electrodes GE. The active contacts AC may be provided to penetrate the second interlayer insulating layer 120 and the first interlayer insulating layer 110 and may be coupled to the first and second source/drain patterns SD1 and SD2.

Figure 22:
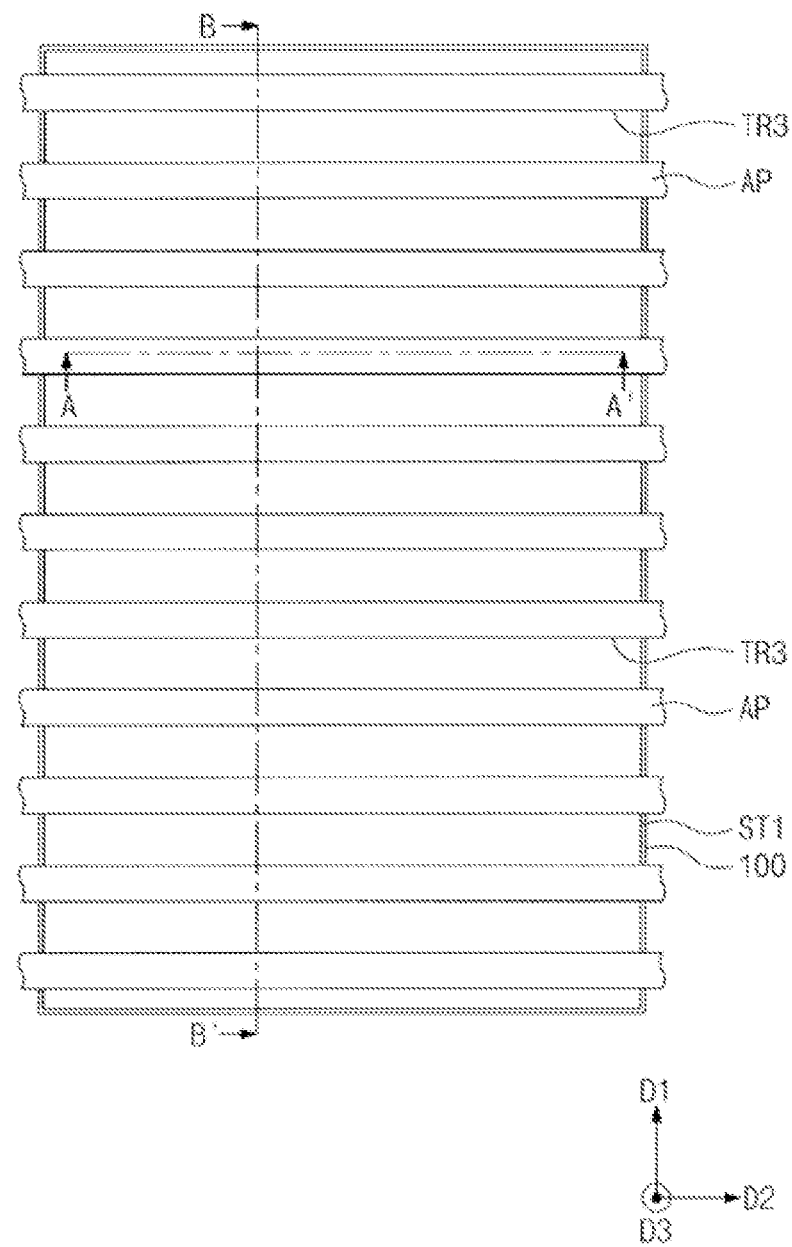
FIGS. 22, 24, and 26 illustrate plan views illustrating a method of fabricating a semiconductor device, according to an example embodiment.
Figure 23A:
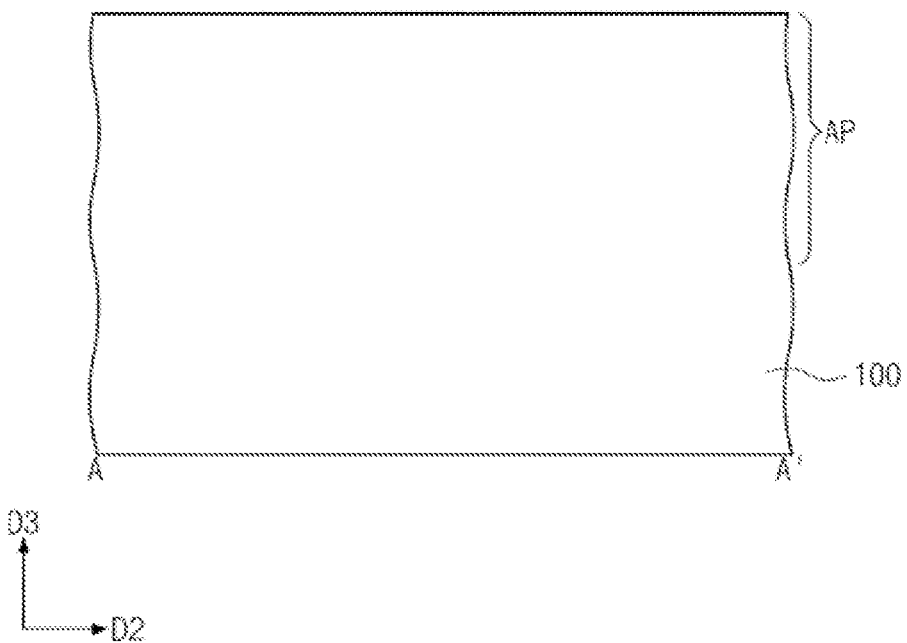
FIGS. 23A, 25A, and 27A illustrate sectional views taken along lines A-A' of FIGS. 22, 24, and 26, respectively.
Figure 23B:
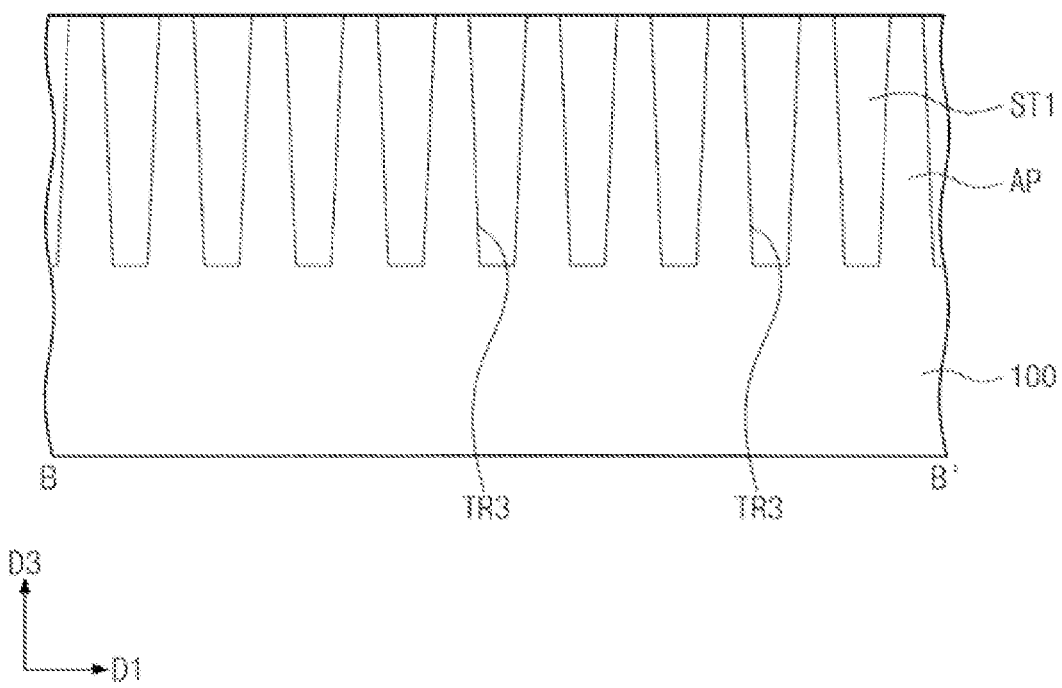
FIGS. 23B, 25B, and 27B illustrate sectional views taken along lines B-B' of FIGS. 22, 24, and 26, respectively.
Figure 24:
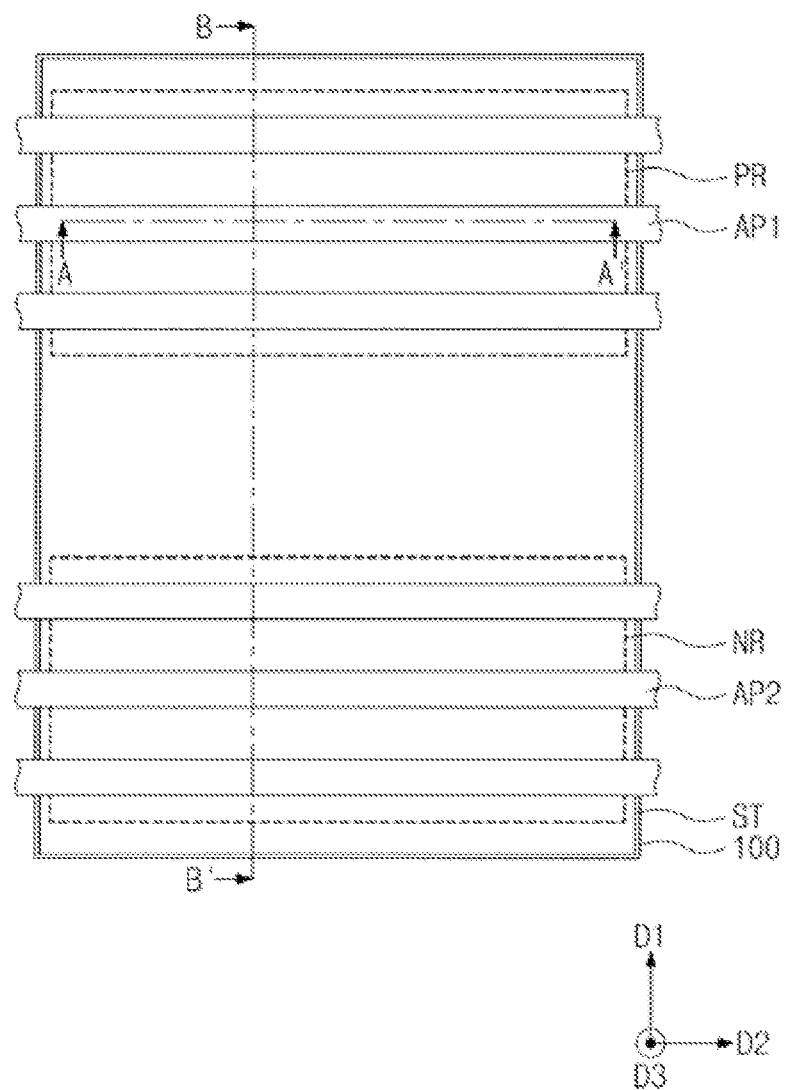
Figure 25A:
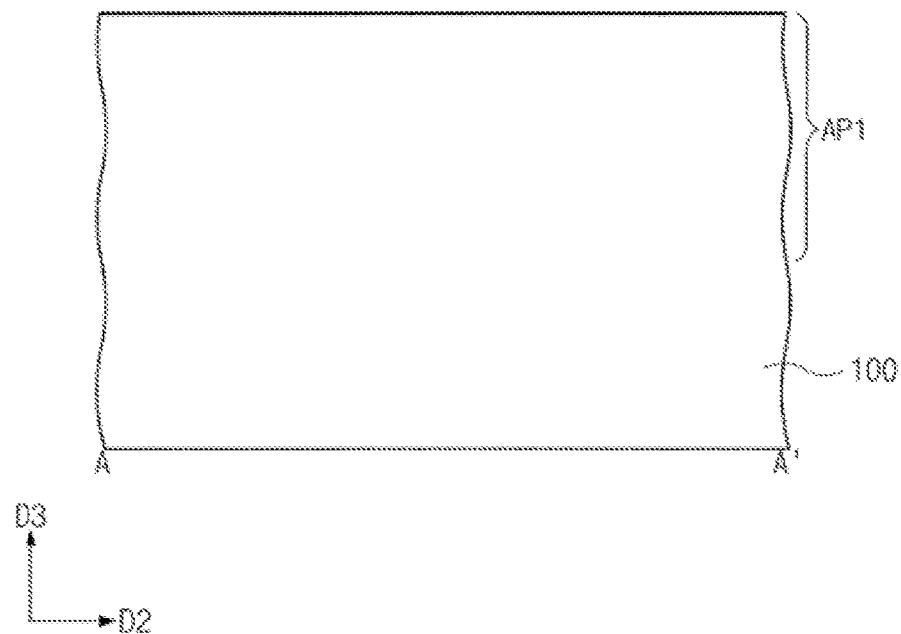
Figure 25B:
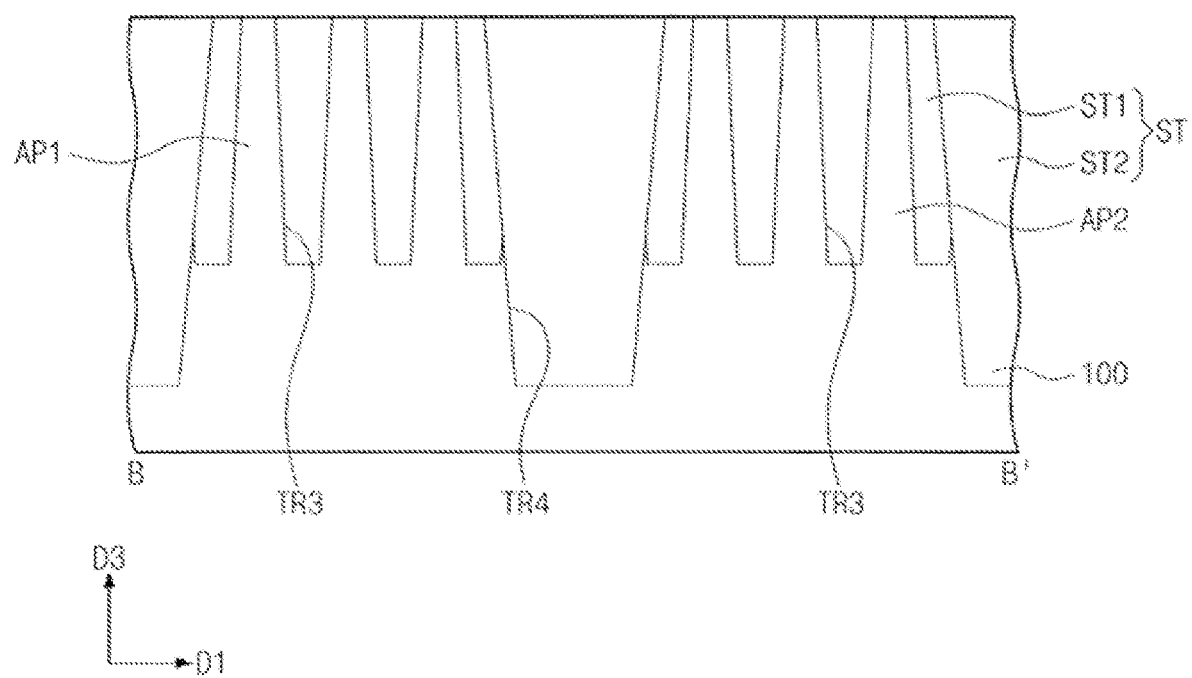
Figure 26:
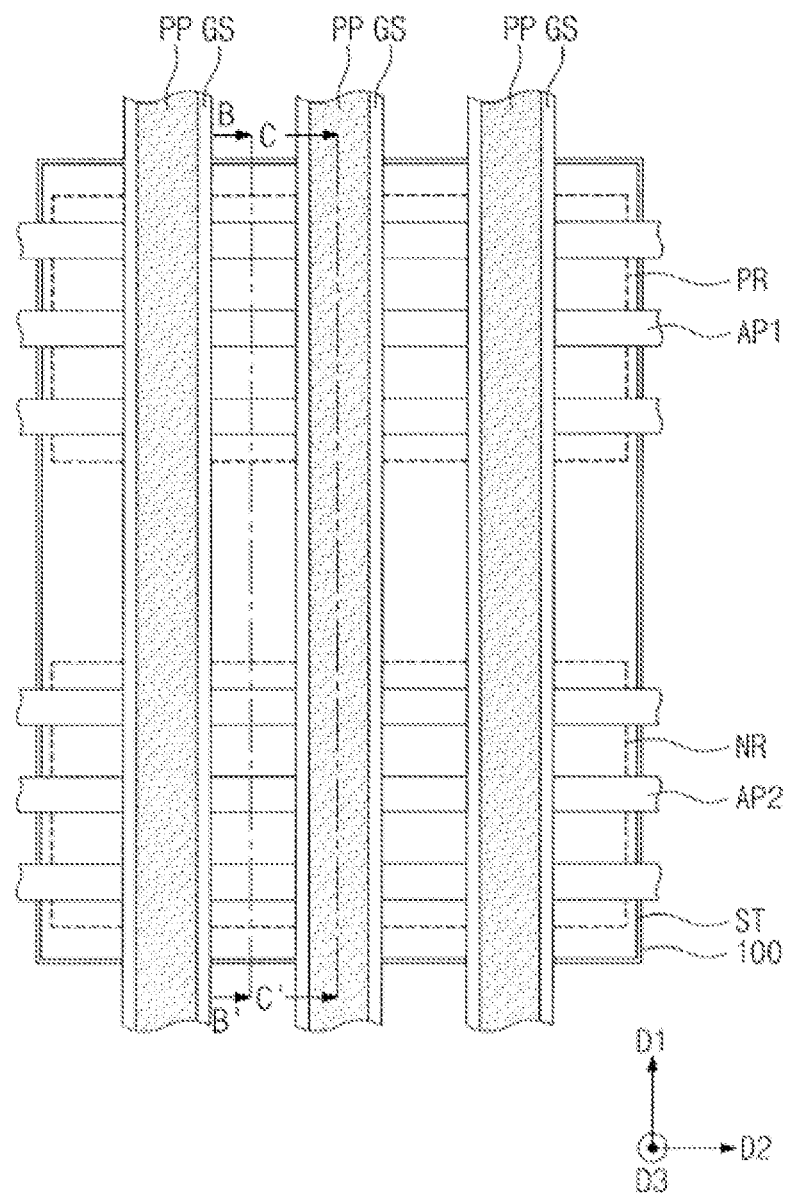
Figure 27A:
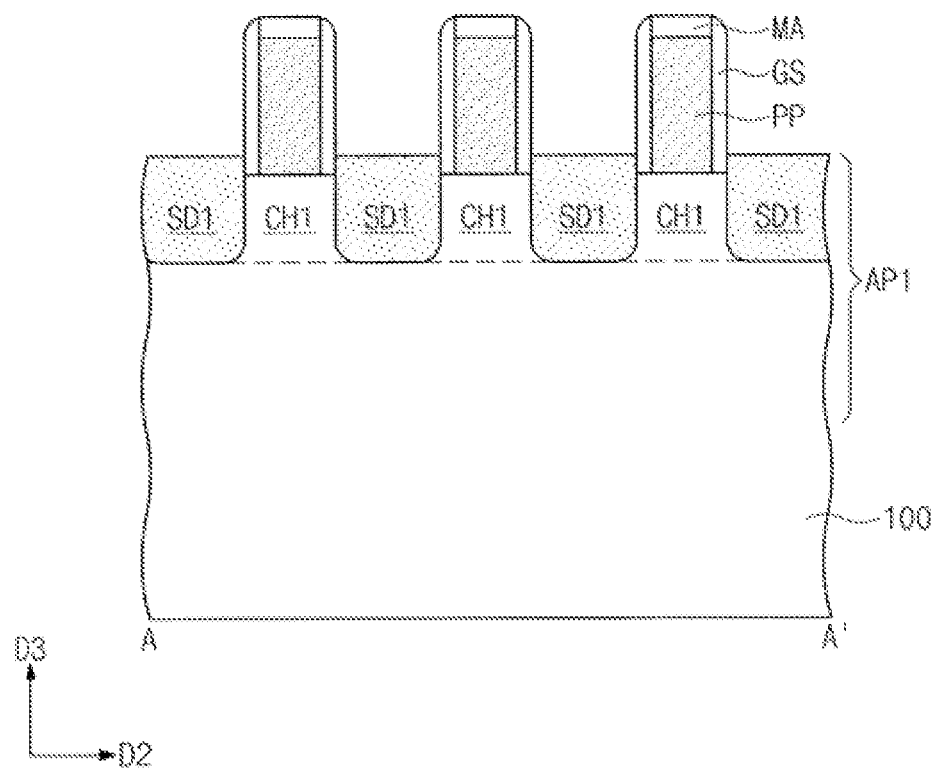
Figure 27B:
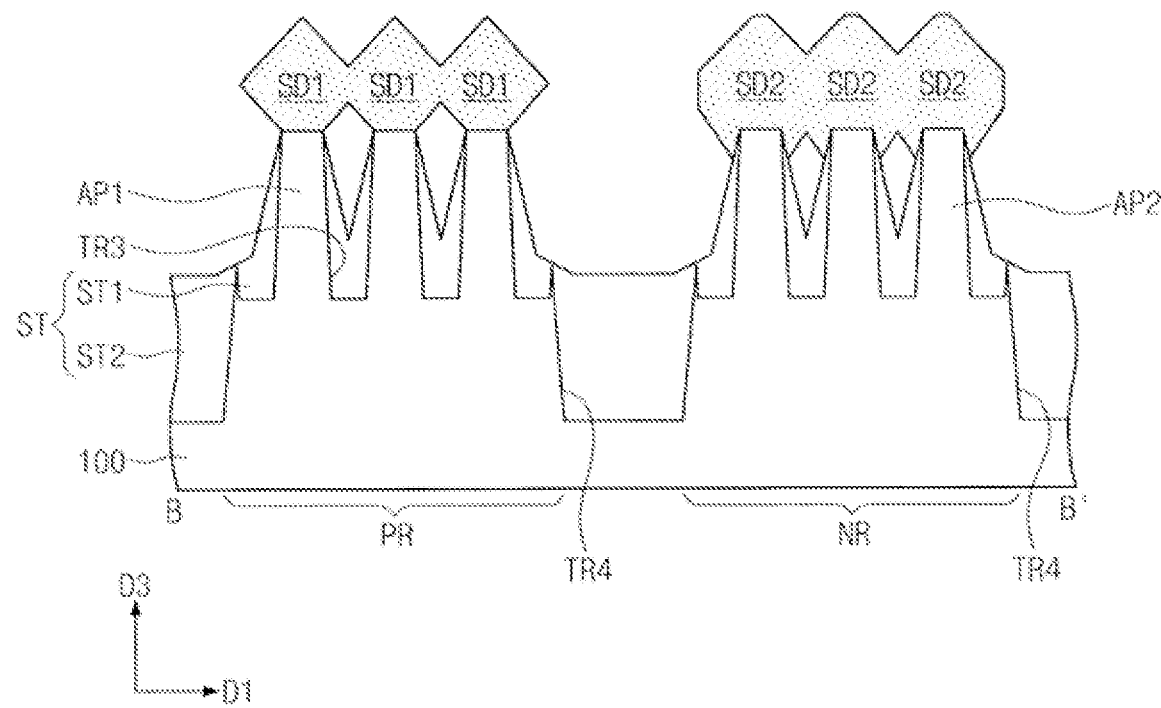
Figure 27C:
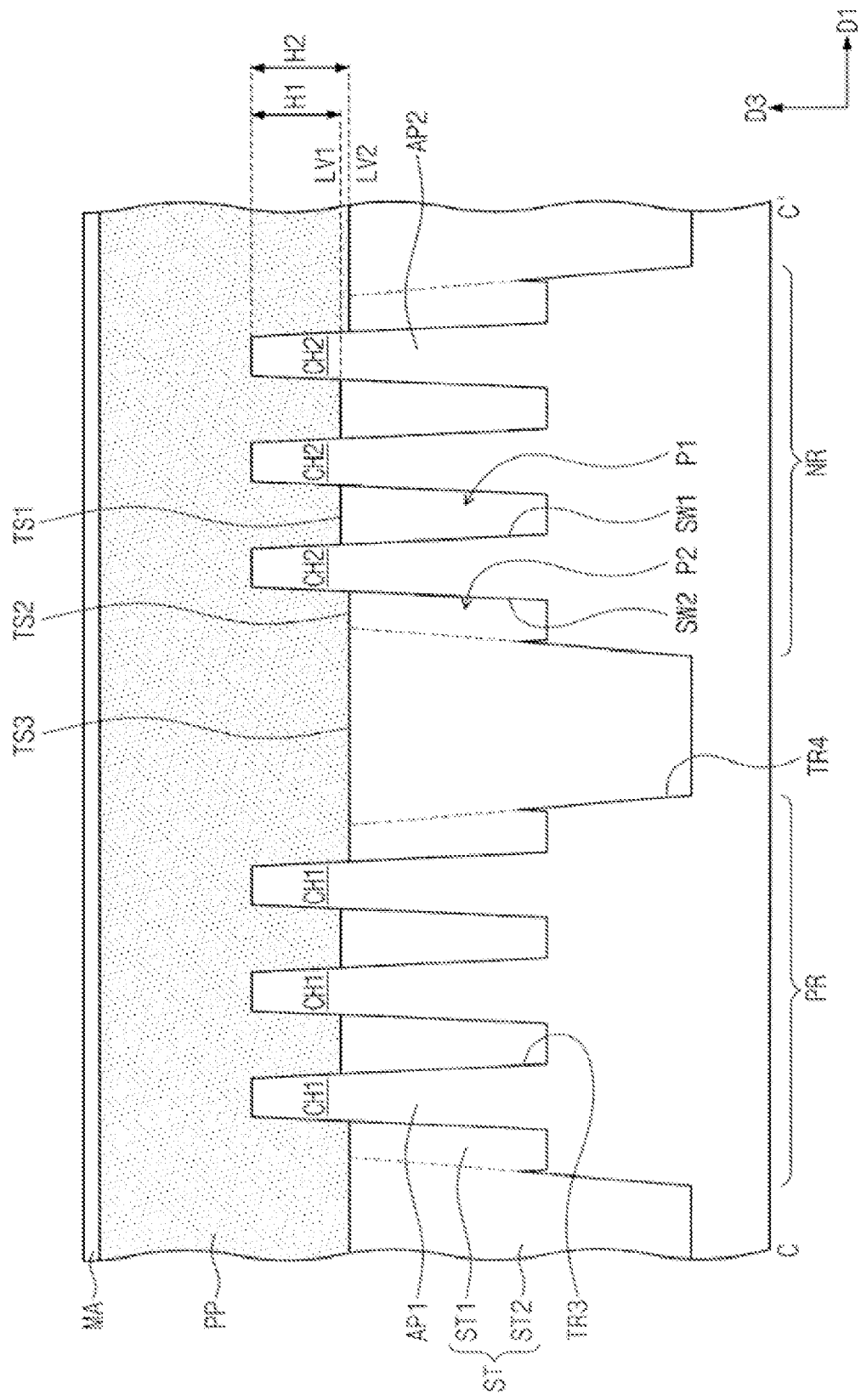
FIG. 27C illustrates a sectional view taken along line C-C' of FIG. 26.

FIGS. 22, 24, and 26 are plan views illustrating a method of fabricating a semiconductor device, according to an example embodiment. FIGS. 23A, 25A, and 27A are sectional views taken along lines A-A' of FIGS. 22, 24, and 26, respectively. FIGS. 23B, 25B, and 27B are sectional views taken along lines B-B' of FIGS. 22, 24, and 26, respectively. FIG. 27C is a sectional view taken along line C-C' of FIG. 26.

In the following description, an element previously described with reference to FIGS. 3 to 15, may be identified by the same reference number without repeating an overlapping description thereof.

Referring to FIGS. 22, 23A, and 23B, the substrate 100 may be patterned to form active patterns AP. The active patterns AP may be formed to have a constant space (or pitch). The first trench TR1 may be formed between an adjacent pair of the active patterns AP. The first trenches TR1 may be formed to have substantially the same depth.

The first device isolation layer ST1 may be formed to fill the first trenches TR1. The first device isolation layer ST1 may be formed by substantially the same method as that for the device isolation layer ST previously described with reference to FIG. 15. By forming the first device isolation layer ST1 by the above-described method, the first device isolation layer ST1 filling the first trench TR1 may be densified. The first device isolation layer ST1 filling the first trench TR1 may include a silicon oxide ($SiO_2$) layer formed by completely oxidizing a preliminary insulating layer. A planarization process may be performed on the first device isolation layer ST1 to expose top surfaces of the active patterns AP.

Referring to FIGS. 24, 25A, and 25B, the substrate 100 may be patterned the fourth trenches TR4 defining the PMOSFET region PR and the NMOSFET region NR. The fourth trench TR4 may be interposed between the PMOSFET region PR and the NMOSFET region NR. The fourth trench TR4 may be formed to have a depth greater than that of the first trench TR1.

During the patterning process, the active patterns AP may be partially removed to form the first active patterns AP1 remaining on the PMOSFET region PR and the second active patterns AP2 remaining on the NMOSFET region NR. A portion of the first device isolation layer ST may be removed during the patterning process.

The second device isolation layer ST2 may be formed to fill the fourth trenches TR4. The formation of the second device isolation layer ST2 may include forming a silicon oxide layer (e.g., undoped silicate glass (USG)) using, e.g., a chemical vapor deposition (CVD) process, performing a hot ion implantation process on the silicon oxide layer, and performing a dry annealing process on the silicon oxide layer. The hot ion implantation process may be performed in substantially the same manner as the hot ion implantation process HIP described with reference to FIGS. 5, 7A, 7B, and 15. By using the hot ion implantation process HIP in forming the second device isolation layer ST2, the second device isolation layer ST2 may be densified. The first and second device isolation layers ST1 and ST2 may constitute a single isolation structure (e.g., the device isolation layer ST).

Referring to FIGS. 26 and 27A to 27C, the device isolation layer ST may be recessed to expose the upper portions of the first and second active patterns AP1 and AP2. An amount of the recessing may be smaller in a portion of the device isolation layer ST, which is located between adjacent ones of the first active patterns AP1 or between adjacent ones of the second active patterns AP2, than at other portions of the device isolation layer ST.

The recess amount of the second device isolation layer ST2 may be greater than that of the first device isolation layer ST1. The first device isolation layer ST1 may include the first portion P1, which is located between adjacent ones of the active patterns AP1 or AP2, and the second portion P2, which is located between the second device isolation layer ST2 and the active pattern AP1 or AP2. The recess amount of the second portion P2 may be greater than that of the first portion P1.

The first portion P1 of the first device isolation layer ST1 may have the first top surface TS1, the second portion P2 of the first device isolation layer ST1 may have the second top surface TS2, and the second device isolation layer ST2 may have the third top surface TS3. The second top surface TS2 and the third top surface TS3 may be substantially coplanar with each other. The first top surface TS1 may be higher than the second top surface TS2 and the third top surface TS3.

The sacrificial patterns PP may be formed to cross the first and second active patterns AP1 and AP2. A pair of the gate spacers GS may be formed on opposite sidewalls of each of the sacrificial patterns PP. The first and second source/drain patterns SD1 and SD2 may be formed at opposite sides of each of the sacrificial patterns PP.

Referring back to FIGS. 20 and 21A to 21C, the sacrificial patterns PP may be replaced with the gate electrodes GE. The first and second interlayer insulating layers 110 and 120 may be formed on the substrate 100. The active contacts AC may be formed to penetrate the first and second interlayer insulating layers 110 and 120 and may be coupled to the first and second source/drain patterns SD1 and SD2.

As described above, embodiments relate to a semiconductor device including a field effect transistor and a method of fabricating the same.

Embodiments may provide a semiconductor device in which field effect transistors with improved electric characteristics are provided, and a method of fabricating the same.

According to some example embodiments, a method of fabricating a semiconductor device may include a process to provide a densified device isolation layer. A device isolation layer may be formed to completely fill a trench having a high aspect ratio. The device isolation layer filling the trench may be completely oxidized and, thus, the device isolation layer may be formed of silicon oxide, or to have substantially the same chemical structure as a silicon oxide layer.

According to some example embodiments, it may be possible to reduce a stress exerted to neighboring active patterns from the device isolation layer and thereby reduce or prevent deformation of the active patterns.

According to some example embodiments, an annealing process may be performed at a relatively low temperature in forming a device isolation layer and, thus, it may be possible to reduce or prevent deterioration of a junction isolation property between well regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   patterning a substrate to form active patterns;
   forming a device isolation layer to fill a trench between the active patterns;
   forming a gate electrode on the active patterns after forming the device isolation layer; and
   forming an interlayer insulating layer to cover the gate electrode,
   wherein:
   forming the device isolation layer includes:
      forming a preliminary insulating layer on the substrate to fill the trench;
      injecting a light species into the preliminary insulating layer by performing a first ion implantation process; and
      performing a wet annealing process on the preliminary insulating layer,
   the first ion implantation process is performed at a temperature of 200° C. to 600° C.,
   the light species includes H, He, C, N, O, Ar, Kr, or Xe, and
   forming the interlayer insulating layer includes performing a second ion implantation process using the light species.

2. The method as claimed in claim 1, wherein forming the device isolation layer further includes performing a bake process on the preliminary insulating layer while providing an oxygen source onto the preliminary insulating layer, before performing the first ion implantation process.

3. The method as claimed in claim 1, wherein forming the preliminary insulating layer includes performing a flowable chemical vapor deposition process.

4. The method as claimed in claim 1, wherein:
   the preliminary insulating layer includes Si—N, Si—H, and N—H bonds, and
   the first ion implantation process includes breaking at least one of the Si—N, Si—H, and N—H bonds in the preliminary insulating layer using accelerated ions.

5. The method as claimed in claim 1, wherein the first ion implantation process includes injecting the light species into the preliminary insulating layer filling the trench.

6. The method as claimed in claim 1, further comprising injecting an impurity into the substrate to form a well region, before forming the active patterns.

7. The method as claimed in claim 1, wherein the first ion implantation process is performed at an ion energy of 10 keV to 150 keV and at a dose of $1.00\ E13/cm^2$ to $1.00\ E17/cm^2$.

8. The method as claimed in claim 1, wherein:
   the active patterns include a first active pattern, a second active pattern, and a third active pattern,
   the trench includes:
      a first trench between the first and second active patterns adjacent to each other, and
      a second trench between the second and third active patterns adjacent to each other, and
   an upper width of the second trench is greater than an upper width of the first trench.

9. The method as claimed in claim 1, further comprising recessing the device isolation layer to expose upper portions of the active patterns,
   wherein:
   the active patterns include a first active pattern and a second active pattern, which are adjacent to each other, and
   the device isolation layer includes:
      a first portion interposed between the first and second active patterns to cover a first sidewall of the first active pattern; and
      a second portion covering a second sidewall opposite to the first sidewall of the first active pattern, the second portion being recessed to have a level of a top surface that is lower than a level of a top surface of the first portion.

10. A method of fabricating a semiconductor device, the method comprising:
    patterning a substrate to form active patterns;
    forming a device isolation layer to fill a trench between the active patterns;
    forming a sacrificial pattern crossing the active patterns;
    forming an interlayer insulating layer on the sacrificial pattern; and
    replacing the sacrificial pattern into a gate electrode,
    wherein:
    forming the device isolation layer includes:
       forming a preliminary insulating layer on the substrate to fill the trench;
       injecting a light species into the preliminary insulating layer by performing a first ion implantation process; and
       performing a wet annealing process on the preliminary insulating layer,
    forming the interlayer insulating layer includes:
       forming a preliminary insulating layer on the sacrificial pattern,
       injecting the light species into the preliminary insulating layer by performing a second ion implantation process, and
       performing a wet annealing process on the preliminary insulating layer,
    the first and second ion implantation processes are each performed at a temperature of 200° C. to 600° C., and
    the light species includes H, He, C, N, O, Ar, Kr, or Xe.

11. The method as claimed in claim 10, wherein forming the interlayer insulating layer further includes performing a bake process on the preliminary insulating layer while providing an oxygen source onto the preliminary insulating layer, before performing the ion implantation process.

12. The method as claimed in claim 10, wherein forming the preliminary insulating layer includes performing a flowable chemical vapor deposition process.

13. The method as claimed in claim 10, wherein:
    the preliminary insulating layer includes Si—N, Si—H, and N—H bonds, and the ion implantation process includes breaking at least one of the Si—N, Si—H, and N—H bonds in the preliminary insulating layer using accelerated ions.

14. The method as claimed in claim 10, wherein the first and second ion implantation processes are each performed at an ion energy of 10 keV to 150 keV and at a dose of 1.00 E13/cm$^2$ to 1.00 E17/cm$^2$.

15. A method of fabricating a semiconductor device, the method comprising:
   forming a preliminary insulating layer on a substrate;
   performing a bake process on the preliminary insulating layer while providing an oxygen source onto the preliminary insulating layer;
   injecting a light species into the preliminary insulating layer by performing a first ion implantation process;
   forming a silicon oxide layer from the preliminary insulating layer by performing a wet annealing process on the preliminary insulating layer,
   forming a gate electrode on the substrate after forming the silicon oxide layer; and
   forming an interlayer insulating layer to cover the gate electrode,
   wherein forming the interlayer insulating layer includes performing a second ion implantation process using the light species,
   wherein the first and second ion implantation processes are each performed at a temperature of 200° C. to 600° C., and
   wherein the light species includes H, He, C, N, O, Ar, Kr, or Xe.

16. The method as claimed in claim 15, wherein forming the preliminary insulating layer includes performing a flowable chemical vapor deposition process.

17. The method as claimed in claim 15, wherein:
   the preliminary insulating layer includes Si—N, Si—H, and N—H bonds, and
   the first ion implantation process includes breaking at least one of the Si—N, Si—H, and N—H bonds in the preliminary insulating layer using accelerated ions.

18. The method as claimed in claim 15, wherein first and second ion implantation processes are each performed at an ion energy of 10 keV to 150 keV and at a dose of 1.00 E13/cm$^2$ to 1.00 E17/cm$^2$.

19. The method as claimed in claim 15, wherein the first ion implantation process includes injecting the light species into the preliminary insulating layer filling a trench.

\* \* \* \* \*